US007860259B2

(12) United States Patent
Onishi et al.

(10) Patent No.: US 7,860,259 B2
(45) Date of Patent: Dec. 28, 2010

(54) PIEZOELECTRIC ACOUSTIC ELEMENT, ACOUSTIC DEVICE, AND PORTABLE TERMINAL DEVICE

(75) Inventors: Yasuharu Onishi, Tokyo (JP); Yasuhiro Sasaki, Tokyo (JP); Nozomi Toki, Tokyo (JP)

(73) Assignee: NEC Corporation (JP)

( * ) Notice: Subject to any disclaimer, the term of this patent is extended or adjusted under 35 U.S.C. 154(b) by 324 days.

(21) Appl. No.: 10/598,446

(22) PCT Filed: Dec. 20, 2004

(86) PCT No.: PCT/JP2004/019010

§ 371 (c)(1), (2), (4) Date: Aug. 30, 2006

(87) PCT Pub. No.: WO2005/094121

PCT Pub. Date: Oct. 6, 2005

(65) Prior Publication Data

US 2007/0177747 A1 Aug. 2, 2007

(30) Foreign Application Priority Data

Mar. 25, 2004 (JP) ............................ 2004-089005

(51) Int. Cl.
*H04R 25/00* (2006.01)
*H01L 41/00* (2006.01)
*H02N 2/00* (2006.01)

(52) U.S. Cl. ...................... 381/190; 381/173; 310/322; 310/334

(58) Field of Classification Search ................. 381/173, 381/174, 190; 310/311, 322, 334
See application file for complete search history.

(56) References Cited

U.S. PATENT DOCUMENTS

| | | | | |
|---|---|---|---|---|
| RE20,213 | E * | 12/1936 | Sawyer | 381/190 |
| 2,284,462 | A * | 5/1942 | Williams | 381/190 |
| 2,367,726 | A * | 1/1945 | Lybarger | 381/173 |
| 3,181,016 | A * | 4/1965 | Rosenman | 381/173 |
| 5,062,139 | A * | 10/1991 | Christensen | 381/173 |
| 6,215,884 | B1 * | 4/2001 | Parrella et al. | 381/190 |

FOREIGN PATENT DOCUMENTS

| | | |
|---|---|---|
| JP | 58-008000 | 1/1983 |
| JP | 63-81495 | 5/1988 |
| JP | 04-022300 | 1/1992 |
| JP | 09-298798 | 11/1997 |
| JP | 10-094093 | 4/1998 |
| JP | 2002-102799 | 4/2002 |
| JP | 2004-274593 | 9/2004 |

OTHER PUBLICATIONS

PCT International Preliminary Report on Patentability dated Nov. 29, 2006 and Translation of the Written Opinion of the related PCT patent application.

* cited by examiner

*Primary Examiner*—Curtis Kuntz
*Assistant Examiner*—Jesse A Elbin
(74) *Attorney, Agent, or Firm*—Hayes Soloway P.C.

(57) ABSTRACT

A piezoelectric acoustic element 1 of the present invention comprising a hollow casing 5 having a opening 3, a piezoelectric element 7 that is disposed in said casing 5 and bends when a voltage is applied thereto, and diaphragm 8 provided at the opening 3 of said casing 5; wherein said piezoelectric element 7 and said diaphragm 8 are joined through a vibration transmitting member 9.

11 Claims, 17 Drawing Sheets

PIEZOELECTRIC ACOUSTIC ELEMENT, ACOUSTIC DEVICE, AND PORTABLE TERMINAL DEVICE

TECHNICAL FIELD

The present invention relates to a piezoelectric acoustic element using a piezoelectric element as a vibration source, and an acoustic device and a portable terminal device provided with the piezoelectric acoustic element using the piezoelectric element as the vibration source.

BACKGROUND ART

A piezoelectric acoustic element using a piezoelectric element as a vibration source has various advantages, such as being compact, lightweight, power-thrifty, and does not leak magnetic flux, and therefore is expected to be used as an acoustic part of a portable terminal device. In particular, since the mounting volume can be significantly reduced in comparison with the conventional electromagnetic acoustic element, the piezoelectric acoustic element is considered as one critical technique for further reducing size of portable telephones.

However, the sound source of the piezoelectric acoustic element is a vibration plate that bends in accordance with the deformation of the piezoelectric element. Therefore, in order to ensure the sound pressure level that is required to reproduce sounds, the vibration plate must be bent above some level and a large vibration plate is required. For example, in the conventional piezoelectric acoustic element, a vibration plate of 20 [mm] in diameter is required to obtain the sound pressure of 90 [dB] when voltage of 1 [V] is applied to the piezoelectric element, and therefore it causes the piezoelectric acoustic element to lose advantages such as compact and lightweight.

Next, the frequency characteristics of the conventional piezoelectric acoustic element are described. The piezoelectric acoustic element has the following problems.

(1) a basic resonant frequency appears in the audible range, (2) a frequency characteristic is included so as to generate an unusual sound pressure near the resonant frequency, and (3) since ceramic used as a piezoelectric material for the piezoelectric element has high stiffness, the basic resonant frequency becomes higher and no sufficient sound pressure can be obtained in a low frequency range.

In order to reproduce the original sound faithfully, the basic resonant frequency must be adjusted at 500 [Hz] or less. So, Japanese Patent Laid-Open No. 4-22300 discloses the technique in which the carbon plate (expansion graphite plate) is used as the vibration plate to improve the frequency characteristic. Also, it is known that the frequency characteristic is improved to some extent by forming the vibration plate into an ellipse.

Next, the frequency-sound pressure characteristic of the conventional piezoelectric acoustic element is described. The conventional piezoelectric acoustic element uses the piezoelectric element as the vibration source, as described above. As the piezoelectric material of the piezoelectric element, ceramic materials and the like with a small loss of mechanical energy during elastic vibration are usually used. Therefore, very high sound pressure can be obtained near the resonance point, however, the irregular frequency-sound pressure characteristic with a large amplitude change will occur in the frequency range except the resonance point. When the amplitude change of the frequency-sound pressure characteristic is large, only sound at a specific frequency is emphasized, and therefore sound quality will deteriorate. So, Japanese Utility Model Laid-Open No. 63-81495 discloses a technique in which a piezoelectric vibrator is buried in flexible foam to flatten the frequency-sound pressure characteristic. Also, Japanese Patent Laid-Open No. 58-8000 discloses a technique that flattens the frequency-sound pressure characteristic by supporting the outer edge of a thin acoustic element by foam formed with an adhesive layer on the surface thereof.

[Patent Document 1] Japanese Patent Laid-Open No. 4-22300

[Patent Document 2] Japanese Utility Model Laid-Open No. 63-81495

[Patent Document 3] Japanese Patent Laid-Open No. 58-8000

DISCLOSURE OF INVENTION

Problems to be Solved by the Invention

The above problems of (1), (2) can be solved by using the technique disclosed in Japanese Patent Laid-Open No. 4-22300 or by using the ellipse vibration plate, however, the sound pressure characteristic will significantly deteriorate. Also, according to the techniques disclosed in Japanese Utility Model Laid-Open No. 63-81495 and Japanese Patent Laid-Open No. 58-8000, the frequency-sound pressure characteristic can be flatten to some extent. However, the frequency-sound pressure characteristic cannot be sufficiently improved to such a sufficient extent that the original sound can be reproduced. Also, it causes deterioration in the sound pressure characteristic as a whole. As described above, it is difficult to realize a piezoelectric acoustic element that has an excellent frequency characteristic and frequency sound pressure characteristic while retaining a compact size and featuring low power consumption.

Means to Solve the Problems

The present invention has its as an object the implementation of a piezoelectric acoustic elements that is small and lightweight, is power-thrifty, and is excellent in acoustic characteristics.

In order to attain the above object, the piezoelectric acoustic element includes a hollow casing having at least one opening; a piezoelectric element is disposed in the casing and bends when a voltage is applied thereto; and a diaphragm is provided at the opening of the casing, the piezoelectric element and the diaphragm are joined through a vibration transmitting member, the diaphragm vibrates when the piezoelectric element bends, and sounds emerge. One end or both ends of the piezoelectric element in a longitudinal direction may be fixed to an inner surface of the casing directly or through a support member. The support member may be elastic or non-elastic.

Two or more diaphragms and vibration transmitting members may be respectively arranged, and two or more diaphragms and/or vibration transmitting members may be mutually different as regards at least one of the following: thickness, materials, and size. Two diaphragms are arranged opposite to each other so that the piezoelectric element is in between them, and two diaphragms may be joined to the piezoelectric element through respective vibration transmitting members. An elastic plate may be joined to the piezoelectric element, and the elastic plate joined to the piezoelectric element may be joined to the diaphragm through the vibration transmitting member.

The piezoelectric element having a laminated structure in which conductive layers and piezoelectric material layers are alternately laminated may be used as a vibration source. Also, as the vibration transmitting member, a spring may be used. Further, as the diaphragm, at least one of these films may be used, polyethylene terephthalate film, polyethersulfone film, polyester film, and polypropylene film.

The acoustic device or the portable terminal device according to the present invention is provided with the piezoelectric acoustic element of the present invention.

In the piezoelectric acoustic element of the present invention, because the piezoelectric element, as the vibration source, and the diaphragm are joined through the elastic vibration transmitting member, the flexion of the piezoelectric element and the elastic reconstruction of the vibration transmitting member act synergistically and the diaphragm vibrates to a large degree. Therefore, even if the flexion of the piezoelectric element is small, the diaphragm will vibrate to a large degree to obtain sufficient sound pressure. Also, even if a diaphragm having a small surface area is used, sufficient sound pressure can be obtained. Accordingly, the piezoelectric acoustic element having excellent sound pressure characteristic and the frequency characteristic can be realized, while maintaining reduction in size and in thickness, low-power consumption, and low cost. Also, when the piezoelectric acoustic element that has these features is used as an acoustic part in an acoustic device and a portable terminal device, size and thickness reduction, lower power consumption, and higher sound quality can be attained in theses deceives.

The above and other objects, features, and advantages of the present invention may be apparent from the following descriptions and drawings that show examples of the present invention.

REFERENCE NUMERALS

Figure 1A:
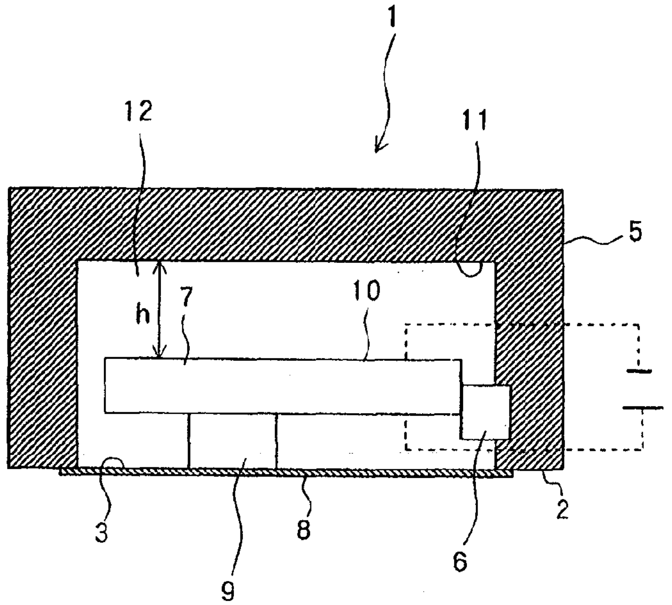
FIG. 1A is a longitudinal sectional view showing an arrangement of a piezoelectric acoustic element according to Embodiment 1.

1 piezoelectric acoustic element
2 bottom surface
3 opening
5 casing
6 support member

7 piezoelectric element
8 diaphragm
9 vibration transmitting member
10 upper surface
11 ceiling surface
12 space
13 lower surface
15 elastic plate
16 lower insulating layer
17 upper insulating layer
18 conductive layer
19 piezoelectric material layer
20 electrode pad
21 foamed rubber
22 upper member
23 lower member
25 leg member
30 acoustic element
31 casing
32 piezoelectric element
33 support member
34 bottom
35 hole
36 connection member
37 vibration plate
38 permanent magnet
38 voice coil
40 vibration plate
41 electrode terminal

BEST MODE FOR CARRYING OUT THE INVENTION

Embodiment 1

Figure 1B:
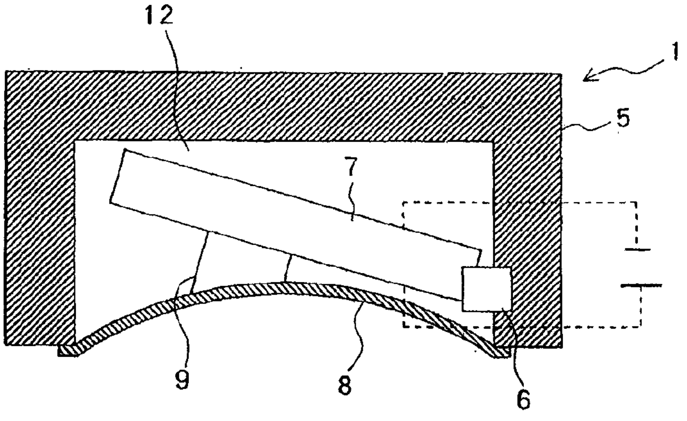
FIG. 1B is a longitudinal sectional view showing a vibration displacement state of a diaphragm.
Figure 1C:
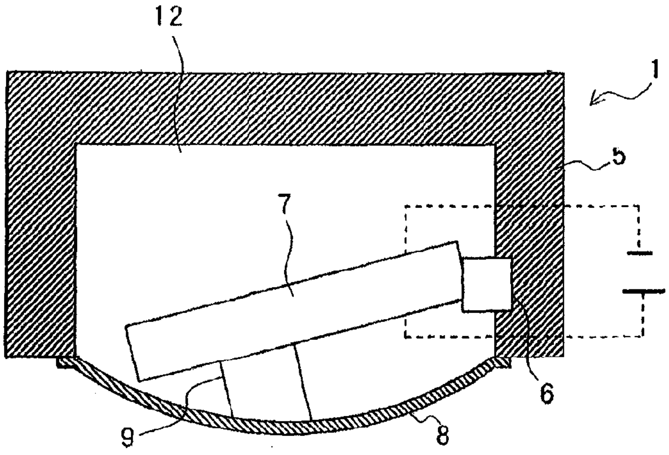
FIG. 1C is a longitudinal sectional view showing a vibration displacement state of a diaphragm.

Hereinafter, explanations are given of embodiments of a piezoelectric acoustic element according to the present invention. FIGS. 1A to 1C are longitudinal sectional views showing schematic arrangements of the piezoelectric acoustic element according to the present embodiment. As shown in FIG. 1A, piezoelectric acoustic element 1 according to the present embodiment has hollow casing 5 formed with opening 3 in bottom surface 2, piezoelectric element 7 in which one end (fixed end) is fixed to the inner surface of casing 5 through support member 6, and diaphragm 8 extended over opening 3 of casing 5. The other end (free end) of piezoelectric element 7 is joined to diaphragm 8 through vibration transmitting member 9. Both support member 6 and vibration transmitting member 9 are made of elastic materials. Also, space 12, in which (h) is the height, is arranged between upper surface 10 of piezoelectric element 7 and ceiling surface 11 of casing 5.

Piezoelectric element 7 to which a voltage is applied repeats the expansion and contraction motion, the expansion and contraction motion of piezoelectric element 7 is transmitted to diaphragm 8 through vibration transmitting member 9, and diaphragm 8 vibrates upward and downward. More specifically, as shown in FIG. 1B, piezoelectric element 7, to which voltage in the forward or reverse direction is applied, bends upward while being pivoted on the fixed end, and diaphragm 8 is deformed in the same direction. At this time, space 12 functions as a clearance allowing piezoelectric element 7 to deform upward. On the other hand, as shown in FIG. 1C, piezoelectric element 7, to which voltage in the reverse or forward direction is applied, bends downward while being pivoted on the fixed end, and diaphragm 8 is deformed in the same direction. In this way, when alternating voltage is applied to piezoelectric element 7, diaphragm 8 deforms (vibrates) upward and downward continuously, and sounds come out. In this arrangement, in piezoelectric acoustic element 1 according to the present embodiment, piezoelectric element 7 and diaphragm 8 are joined through elastic vibration transmitting member 9. Therefore, vibration transmitting member 9 elastically deforms in accordance with the expansion and contraction motion of piezoelectric element 7, and repulsion is produced. Accordingly, the expansion and contraction motion of piezoelectric element 7 is promoted, the vibration displacement amount of diaphragm 8 is increased, and the sound pressure is improved. Further, since piezoelectric element 7, to which vibration transmitting member 9 is joined, increases in weight, a larger inertial force is exerted during the expansion and contraction motion of piezoelectric element 7, and the basic resonant frequency of sounds that come out are reduced. Additionally, since the fixed end of piezoelectric element 7 is fixed to casing 5 through elastic support member 6 and the free end is joined to diaphragm 8 through elastic vibration transmitting member 9, even if a shock is given to casing 5 by being a dropped or the like, most of the shock is absorbed by support member 6 and/or vibration transmitting member 9, and piezoelectric element 7 avoids being broken.

Piezoelectric element 7 shown in FIG. 1 has a layered structure formed by sequentially laminating a lower insulating layer, a lower electrode layer (conductive layer), a piezoelectric material layer, an upper electrode layer (conductive layer), and an upper insulating layer. When zirconic acid or lead zirconate titanate (PZT) is used as the material of the piezoelectric material layer, warpage after ceramic sintering can be reduced and the reliability of the piezoelectric element is improved. Also, the flattening step, such as polishing, after ceramic sintering, can be omitted, and therefore the cost of manufacturing can be reduced. Further, silver or silver/palladium alloy is used as the material for the electrode layer, sintering distortion can be reduced when the electrode layer and the piezoelectric material layer are integrally sintered, and therefore, the piezoelectric element becomes easy to be manufactured by integrated sintering. Needless to say, as materials for the piezoelectric material layer and the electrode layer, existing materials, except for the above materials, may be selected and used, as appropriate.

The conventional piezoelectric acoustic element generates sound that is emphasized at a specific frequency. The reason is that the Q factor is high when the piezoelectric acoustic element is regarded as equivalent to an electric circuit element. Therefore, when diaphragm 8 shown in FIG. 1 is made of a material having a low Q factor, Q factor of the piezoelectric element is restrained, and the frequency can be made average. Also, when diaphragm 8 is made of a material that is resistant to displacement, high sound pressure can be obtained. Further, when diaphragm 8 is made of the material that can be easily to be manufactured, variations on film thickness are reduced, and the quality becomes stable. In view of the above matters comprehensively, a polyethylene terephthalate film (PET film), a polyethersulfone film (PES film), a polyester film (PE film), and a polypropylene (PP film) are suitable to materials for diaphragm 8.

Embodiment 2

Figure 2:
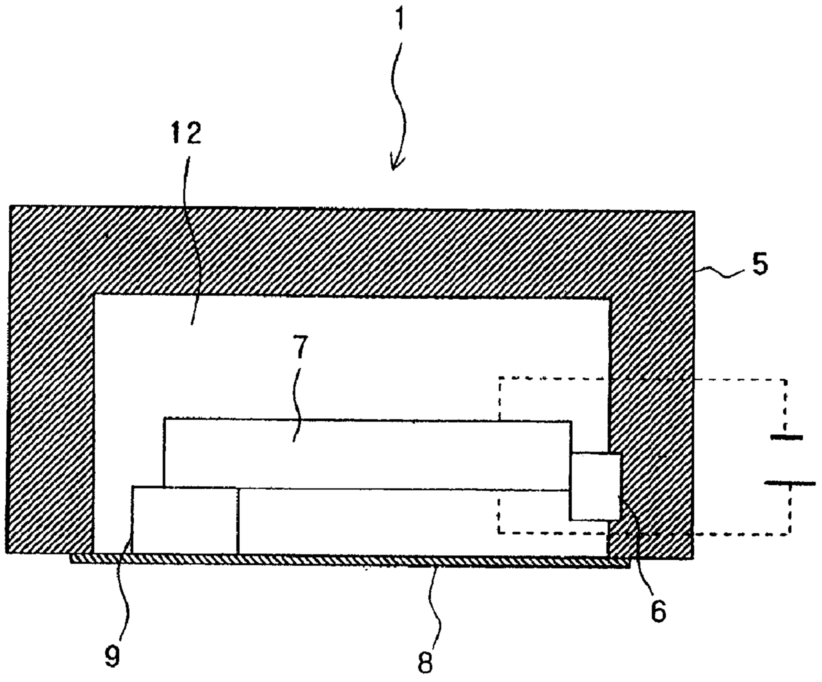
FIG. 2 is a longitudinal sectional view showing an arrangement of a piezoelectric acoustic element according to Embodiment 2.

Next, explanations are given of another embodiment of the piezoelectric acoustic element according to the present invention. FIG. 2 is a longitudinal sectional view showing a schematic arrangement of a piezoelectric acoustic element according to the present embodiment. As shown in FIG. 2, the basic structure of the piezoelectric acoustic element according to the present embodiment is similar to that of Embodiment 1. The present embodiment is different from Embodiment 1 in following two points. One point is that the fixed end of piezoelectric element 7 is fixed to the inner surface of casing 5 through non-elastic support member 6. The other point is that the free end of piezoelectric element 7 is joined to diaphragm 8. Incidentally, in piezoelectric acoustic element 1 shown in FIG. 1, diaphragm 8 is joined to any position between the approximate center in the longitudinal direction and the free end of piezoelectric element 7. In piezoelectric element 7, in which the fixed end is fixed to casing 5, the amount of displacement of the free end is largest. Therefore, the free end is joined to diaphragm 8, thereby causing diaphragm 8 to vibrate more effectively. In other words, piezoelectric acoustic element 1 according to the present embodiment has the advantage that a sufficient sound pressure can be ensured even if diaphragm 8 has a small surface in area.

Based on the above explanations, it can be understood that the variation amount of the free end is further increased and that diaphragm 8 can be vibrated to a large degree when piezoelectric element 7 is lengthened. Also, it can be understood that the length of piezoelectric element 7 and the area of diaphragm 8 are suitably combined, thereby reducing the size of the piezoelectric acoustic element while ensuring required sound pressure.

Embodiment 3

Figure 3:
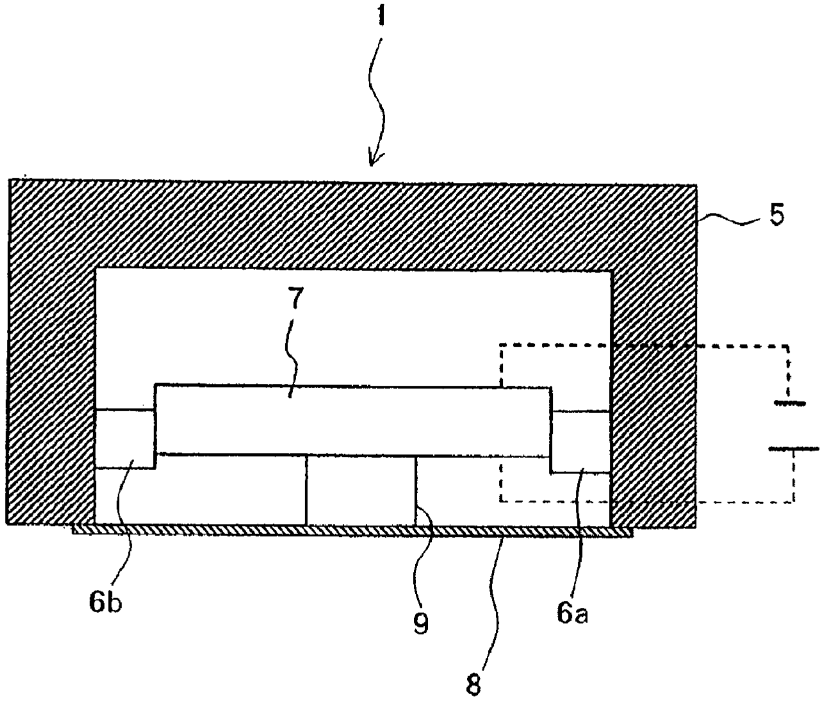
FIG. 3 is a longitudinal sectional view showing an arrangement of a piezoelectric acoustic element according to Embodiment 3.

Next, explanations are given of yet another embodiment of the piezoelectric acoustic element according to the present invention. FIG. 3 is a longitudinal sectional view showing a schematic arrangement of a piezoelectric acoustic element according to the present embodiment. As shown in FIG. 3, the basic structure of the piezoelectric acoustic element according to the present embodiment is similar to that of Embodiment 1. The present embodiment is different from Embodiment 1 in that both ends of piezoelectric element 7 in the longitudinal direction are fixed to the inner surface of casing 5 through support members 6*a*, 6*b*. Piezoelectric acoustic element 1 according to the present embodiment has the same structure as the piezoelectric acoustic element of Embodiment 1 and has the same effects. Further, the piezoelectric acoustic element, characterized in that the both ends of piezoelectric element 7 in the longitudinal direction are fixed to the inner surface of casing 5, has an advantage that the junction strength between piezoelectric element 7 and casing 5 is further improved.

As well, there is also an advantage that two support members 6*a*, 6*b* are made different in coefficients of elasticity, thickness, areas, and the like, thereby adjusting the basic resonant frequency of sounds that come out. Incidentally, in piezoelectric acoustic element 1, according to the present embodiment, since both ends of piezoelectric element 7 in the longitudinal direction are fixed to casing 5, the approximate center of piezoelectric element 7 in the longitudinal direction is joined to diaphragm 8. However, the junction position between piezoelectric element 7 and diaphragm 8 is not limited to the position shown in FIG. 3.

Embodiment 4

Figure 4:
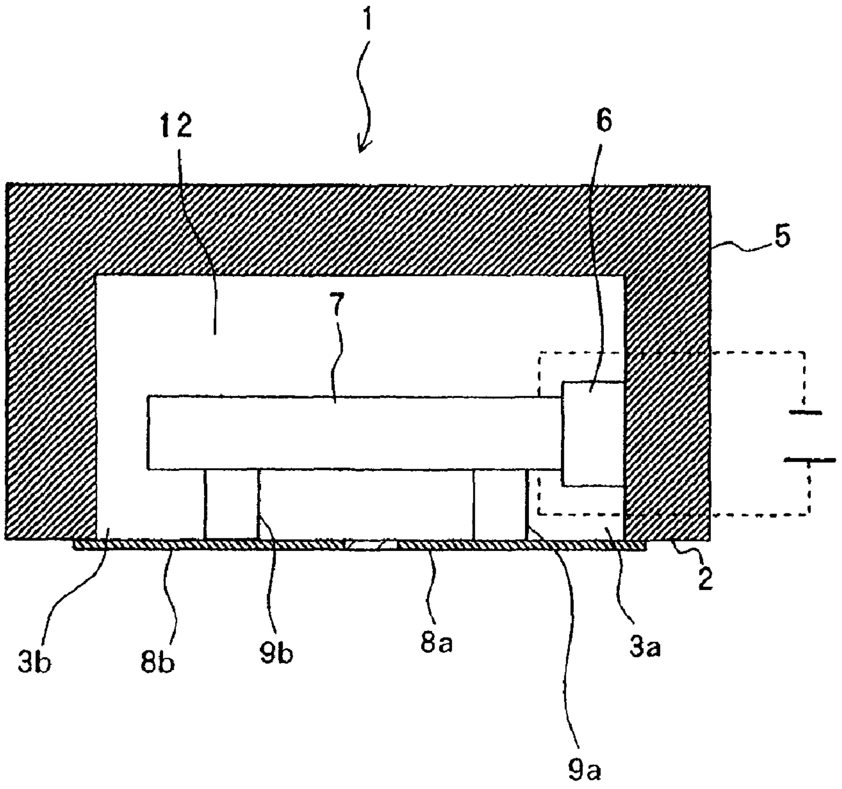
FIG. 4 is a longitudinal sectional view showing an arrangement of a piezoelectric acoustic element according to Embodiment 4.

Next, explanations are given of still another embodiment of the piezoelectric acoustic element according to the present invention. FIG. 4 is a longitudinal sectional view showing a schematic arrangement of a piezoelectric acoustic element according to the present embodiment. As shown in FIG. 4, the basic structure of the piezoelectric acoustic element according to the present embodiment is similar to that of Embodiment 1. The present embodiment is different from Embodiment 1 in the following two points. One point is that two independent openings 3*a*, 3*b* are formed in bottom surface 2 of casing 5, and diaphragms 8*a*, 8*b* are extended over openings 3*a*, 3*b*. The other point is that single piezoelectric element 7 is joined to two diaphragms 8*a*, 8*b* through two independent vibration transmitting members 9*a*, 9*b*, respectively.

Piezoelectric acoustic element 1 according to the present embodiment has the same structure as the piezoelectric acoustic element of Embodiment 1 and has the same effects. Further, piezoelectric acoustic element 1, characterized in that piezoelectric element 7 is fixed to two diaphragms 8*a*, 8*b* through two independent vibration transmitting members 9*a*, 9*b*, respectively, has an advantage that higher sound pressure can be obtained because sounds come out from two diaphragms 8*a*, 8*b*. As well, there is also an advantage that two vibration transmitting members 9*a*, 9*b* and two diaphragms 8*a*, 8*b* are made from different each other in thickness, height, materials, and the like, thereby giving different resonant frequencies to sounds that come out. These advantages indicate that the frequency band of reproducible sound can be enlarged. Also, the advantage that, when a shock is given to casing 5 by being dropped or the like, the shock is absorbed by the vibration transmitting members and the support members and is not transmitted to the piezoelectric element, is similar to that of the piezoelectric acoustic elements, which are explained above. However, in piezoelectric acoustic element 1 of the present embodiment having two independent vibration transmitting members 9*a*, 9*b*, because the shock is dispersed and absorbed by two vibration transmitting members 9*a*, 9*b*, safety is further enhanced.

Embodiment 5

Figure 5:
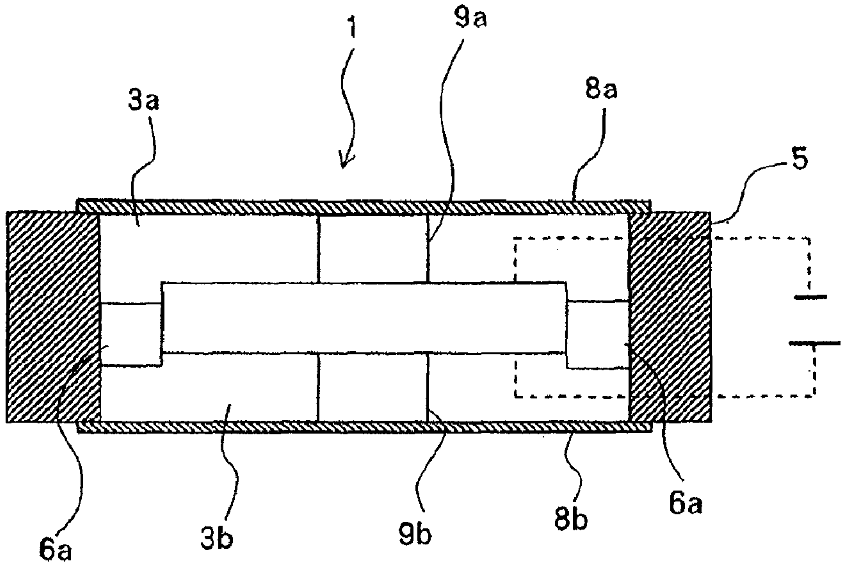
FIG. 5 is a longitudinal sectional view showing an arrangement of a piezoelectric acoustic element according to Embodiment 5.

Next, explanations are given of still another embodiment of the piezoelectric acoustic element according to the present invention. FIG. 5 is a longitudinal sectional view showing a schematic arrangement of a piezoelectric acoustic element according to the present embodiment. As shown in FIG. 5, piezoelectric acoustic element 1 according to the present embodiment is similar to the piezoelectric acoustic element of Embodiment 4 in that diaphragms 8*a*, 8*b* are extended over two openings 3*a*, 3*b* formed in casing 5. The present embodiment is different from Embodiment 4 in that two openings 3*a*, 3*b* are formed on different surfaces of casing 5. Incidentally, the present embodiment is similar to Embodiment 4 in that single piezoelectric element 7 is joined to two diaphragms 8*a*, 8*b* through two independent vibration transmitting members 9*a*, 9*b*. Therefore, the operations and effects obtained by this arrangement are similar to those of piezoelectric acoustic element of Embodiment 4. However, in piezoelectric acoustic element 1 of the present embodiment, because diaphragms 8*a*, 8*b* are arranged at the upper and lower sides (both sides) of piezoelectric acoustic element 7, piezoelectric acoustic element 7 can be made shorter than the piezoelectric acoustic element of Embodiment 4. Further, when each of diaphragms 8*a*, 8*b* has the same surface area, the space that is necessary to arrange two diaphragms 8*a*, 8*b* can be smaller than that of the diaphragms 8*a*, 8*b* according to Embodiment 4.

The surface areas of diaphragms 8*a*, 8*b* arranged in piezoelectric acoustic element 1 shown in FIGS. 4 and 5 are smaller those that of piezoelectric acoustic element 1 shown in FIG. 1 (piezoelectric acoustic element 1 having one diaphragm 8). However, in piezoelectric acoustic element 1 shown in FIGS. 4 and 5, since two diaphragms 8*a*, 8*b* vibrate simultaneously, the same level of sound pressure can be obtained as in piezoelectric acoustic element 1 shown in FIG. 1 or the like.

Embodiment 6

Figure 6:
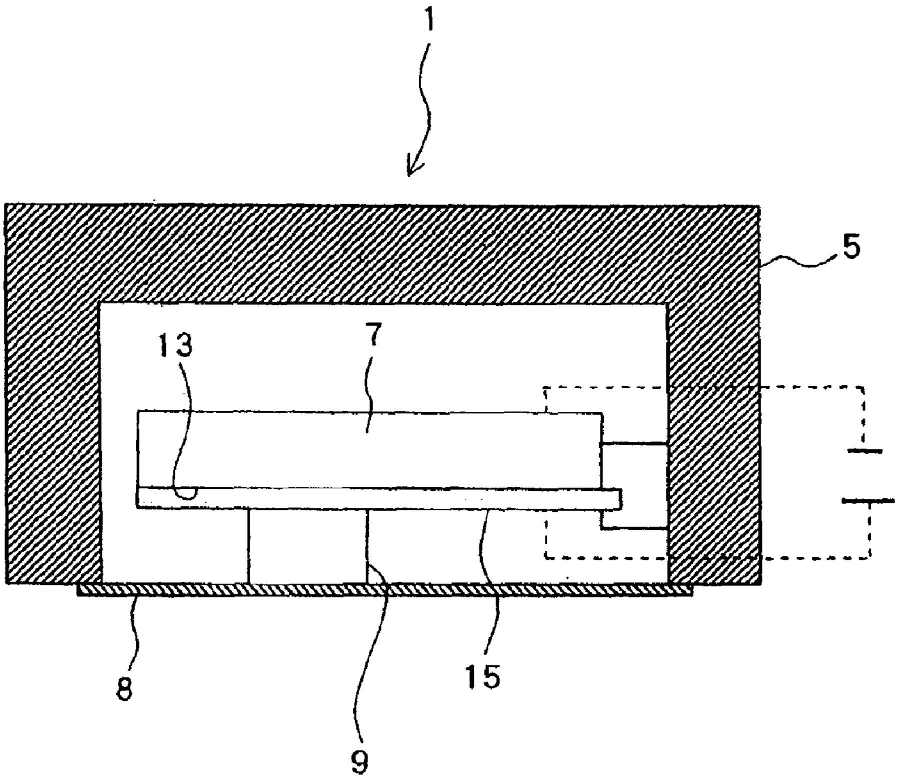
FIG. 6 is a longitudinal sectional view showing an arrangement of a piezoelectric acoustic element according to Embodiment 6.

Next, explanations are given of still another embodiment of the piezoelectric acoustic element according to the present invention. FIG. 6 is a longitudinal sectional view showing a schematic arrangement of a piezoelectric acoustic element according to the present embodiment. As shown in FIG. 6, piezoelectric acoustic element 1 according to the present embodiment is similar to the piezoelectric acoustic element of Embodiment 1. The present embodiment is different from Embodiment 1 in that elastic plate 15 is arranged on the bottom surface of piezoelectric acoustic element 7. Piezoelectric acoustic element 1 of the present embodiment has the same basic arrangement as piezoelectric acoustic element 1 of Embodiment 1, and has the same operations and effects.

However, piezoelectric acoustic element 7, which is integrated with elastic plate 15, appears to have a lower degree of stiffness, compared to the same kind of piezoelectric elements that do not have any elastic plate 15, and therefore, the amount of displacement increases with bending. In other words, piezoelectric element 7 shown in FIG. 6 can causes diaphragm 8 to vibrate to a large degree than the same kind of piezoelectric elements having no elastic plate 15. In view of these points, the thickness of elastic plate 15 preferably occupies one-eighth or more of the total of the thickness of piezoelectric element 7 and the thickness of elastic plate 15. Also, since piezoelectric element 7, with which elastic plate 15 is integrated, is increased in weight in comparison with the same kind of piezoelectric elements having no elastic plate 15, a larger inertial force is applied when piezoelectric element 7 bends, and the basic frequency of sounds that come out is further reduced.

Also, when elastic plate 15 is made of a material having a larger mass, such as metal, a still larger inertial force can be applied while piezoelectric element 7 bends, and therefore the basic frequency is further reduced. This indicates that the displacement amount of piezoelectric element 7 and the resonant frequency of sounds that come out can be adjusted without changing the size and the shape of expensive piezoelectric ceramic by adding inexpensive elastic plate 15 to piezoelectric element 7. Additionally, piezoelectric element 7 with which elastic plate 15 is integrated, is improved in durability, and it is difficult for cracks and the like to occur. As a material for metal elastic plate 15, for example, brass is suitable.

When a plate spring having a high coefficient of elasticity is used as elastic plate 15, the apparent elasticity of piezoelectric element 7 is increased, and the displacement amount of piezoelectric element 7, while the voltage is applied, is increased. Also, when a slit is formed in the plate spring, the apparent elasticity of piezoelectric element 7 is further increased and the junction area between the plate spring and piezoelectric element 7 is reduced, and therefore manufacturing becomes easy.

Embodiment 7

Figure 7:
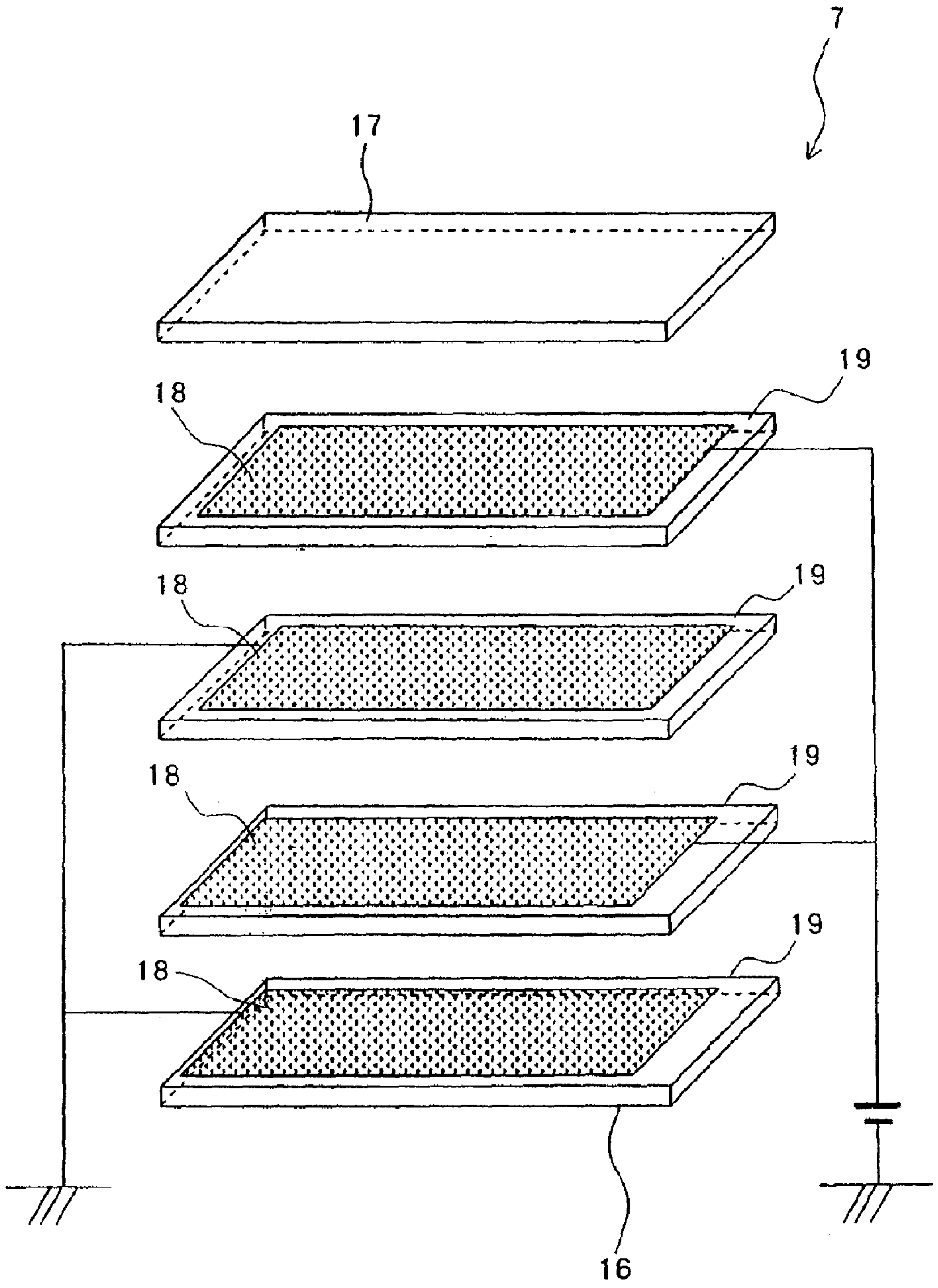
FIG. 7 is a perspective exploded view showing an arrangement of a piezoelectric element arranged in a piezoelectric acoustic element according to Embodiment 7.

Next, explanations are given of still another embodiment of the piezoelectric acoustic element according to the present invention. The basic arrangement of the piezoelectric acoustic element according to the present embodiment is similar to the piezoelectric acoustic element of Embodiment 1. The present embodiment is different from Embodiment 1 in the structure of piezoelectric element 7 as a vibration source. FIG. 7 schematically shows an arrangement of a piezoelectric element arranged in a piezoelectric acoustic element according to the present embodiment. Piezoelectric element 7 has a multi-layered-structure (laminated structure) in which conductive layers 18 and piezoelectric material layers 19 are alternately laminated between lower insulating layers 16 and upper insulating layers 17. It is known that piezoelectric element 7 of the multi-layered structure, as shown in FIG. 7, is power-thrifty and has a larger vibration displacement amount than piezoelectric element 7 of Embodiment 1. Therefore, the piezoelectric acoustic element of the present embodiment has an advantage that a sufficient sound pressure can be obtained using less power. Also, piezoelectric element 7 shown in FIG. 7 is prevented from being displaced or bent during sintering by the sintering promotion effects of the conductive layer material when being manufactured. Therefore, high flatness is provided without applying another flattening process, and elastic plate 15 shown in FIG. 6 or the like can be joined with no interspace.

Embodiment 8

Figure 8:
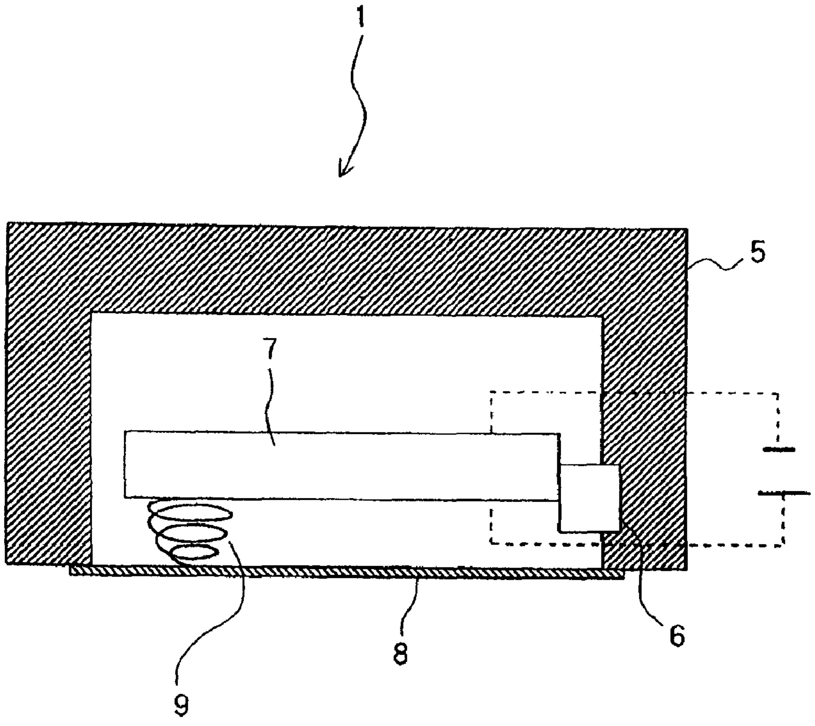
FIG. 8 is a longitudinal sectional view showing an arrangement of a piezoelectric acoustic element according to Embodiment 8.

Next, explanations are given of still another embodiment of the piezoelectric acoustic element according to the present invention. FIG. 8 is a longitudinal sectional view showing a schematic arrangement of a piezoelectric acoustic element according to the present embodiment. As shown in FIG. 8, piezoelectric acoustic element 1 according to the present embodiment is similar to the piezoelectric acoustic element of Embodiment 1. The present embodiment is different from Embodiment 1 in that vibration transmitting member 9 is a coil spring shaped like circular cone. Piezoelectric acoustic element 1 of the present embodiment has the same basic arrangement as piezoelectric acoustic element 1 of Embodiment 1, and has the same operations and effects. Further, coil spring 9 repeats energy storage and energy release in accordance with the expansion and contraction motion of piezoelectric element 7, whereby the expansion and contraction motion of piezoelectric element 7 is promoted. Accordingly, piezoelectric acoustic element 1 of the present embodiment has an advantage that the vibration displacement amount of diaphragm 8 is large and sound pressure is high. Also, the shock caused when casing 5 or the like is dropped is absorbed by coil spring 9, and piezoelectric element 7 is prevented from being broken. Coil spring 9 may be replaced with a plate spring or a scroll spring. In any case, a spring having a suitable spring coefficient is selected, thereby maximizing the vibration of diaphragm 8 to obtain high sound pressure.

Example 1

Figure 9A:
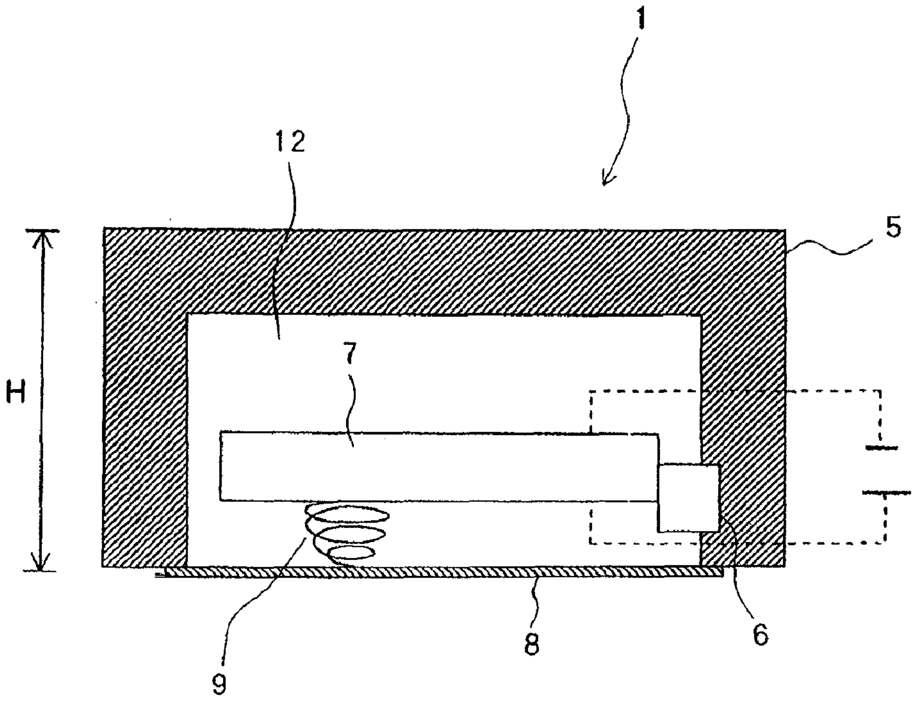
FIG. 9A is a longitudinal sectional view showing an arrangement of a piezoelectric acoustic element according to Example 1.

Detailed explanations are given of the piezoelectric acoustic element of the present invention with reference to an example. FIG. 9A is a longitudinal sectional view showing a schematic arrangement of a piezoelectric acoustic element according to Example 1, and FIG. 9B is a transverse sectional view.

Figure 10:
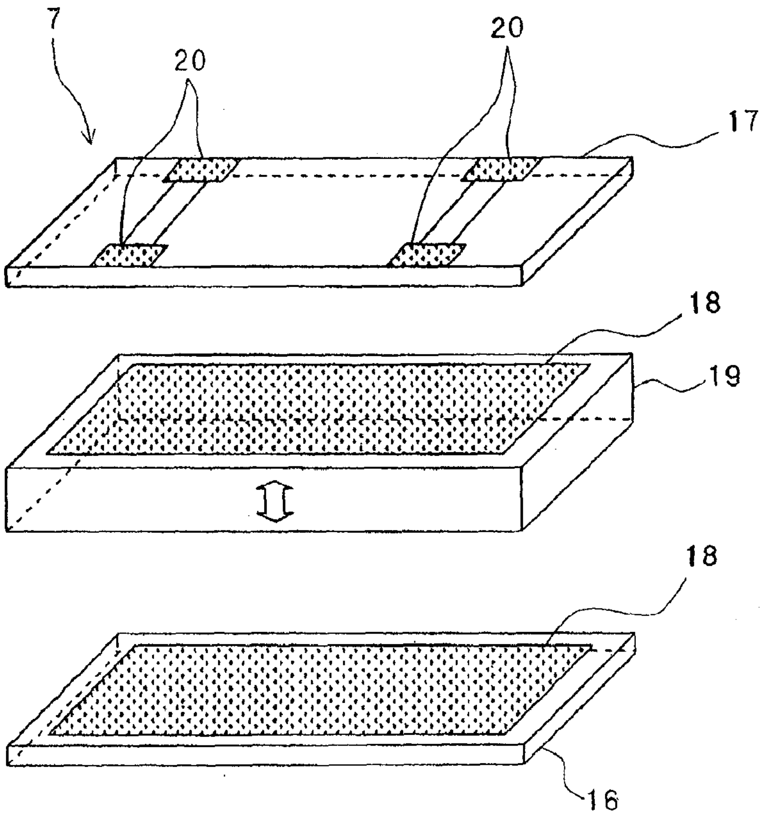
FIG. 10 is a perspective exploded view showing an arrangement of a piezoelectric element shown in FIG. 9.

In piezoelectric acoustic element 1 according to the present example, piezoelectric element 7 having an arrangement shown in FIG. 10 is arranged as a vibration source in casing 5 made of polypropylene resin having a thickness of 0.3 [mm]. Lower insulating layers 16 and upper insulating layers 17 of piezoelectric element 7 are 15 [mm] in length, 4 [mm] in width, and 50[μm] in thickness. Piezoelectric material layers 19 is 15 [mm] in length, 4 [mm] in width, and 300 [μm] in thickness. Upper and lower electrode layers (conductive layers) 18 are 3 [μm] in thickness. Therefore, piezoelectric element 7 has outer dimensions of 15 [mm] in length, 4 [mm] in width, and 0.4 [mm] in thickness. Also, lead zirconate titanate (PZT) ceramic is used for lower insulating layer 16, upper insulating layer 17, and piezoelectric material layer 19, and silver/palladium alloy (weight ratio 7:3) is used for electrode layers 18. Further, piezoelectric element 7 is manufactured by the green sheet method and is fired at 1100° C. in the atmosphere for two hours. Moreover, a silver electrode having a thickness of 8 [μm] is formed as an external electrode that is used to electrically connect to electrode layers 18. Also, piezoelectric material layers 19 is polarized in the film thickness direction by the polarization process. Electrode pads 20 formed on the surface of upper insulating layers 17 are electrically connected by copper foil having a thickness of 8 [μm]. Further, two electrode terminal leads that are 0.2 [mm] in diameter are drawn from electrode pads 20, which are electrically connected, through a solder portion that is 1 [mm] in diameter and 0.5 [mm] in height.

Figure 11:
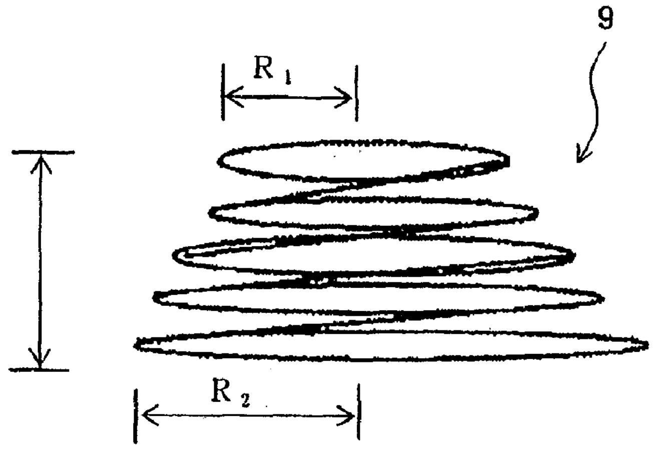
FIG. 11 is a side view showing a vibration transmitting member shown in FIG. 9.

In the piezoelectric acoustic element according to the present example, a corn coil spring shown in FIG. 11 is used as vibration transmitting member 9 that joins piezoelectric element 7 to diaphragm 8. The corn coil spring is 0.4 [mm] in height (h), has a 2 [mm] minimum coil radius (R1), a 4 [mm] maximum coil radius (R2), and is made of a stainless steel wire. Also, as shown in FIG. 9A, the minimum coil radius surface of the coil spring is joined to lower surface 13 of piezoelectric element 7 and the maximum coil radius surface is joined to diaphragm 8 by epoxy adhesive, respectively. Further, diaphragm 8 shown in FIGS. 9A and 9B is a circular polyethylene terephthalate film that is 15 [mm] in diameter and 0.1 [mm] in thickness.

Figure 9B:
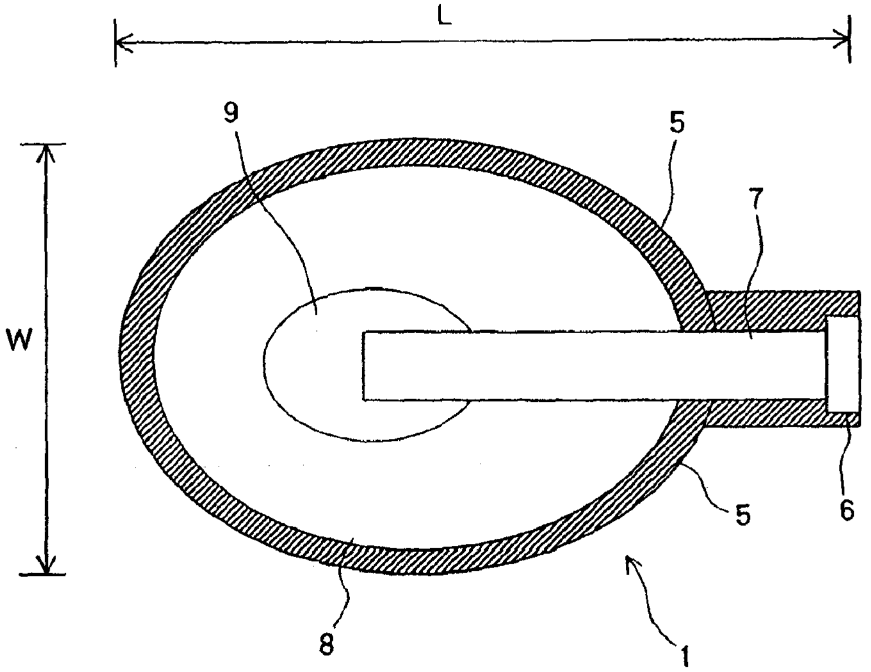
FIG. 9B is a transverse sectional view showing an arrangement of a piezoelectric acoustic element according to Example 1.

Piezoelectric acoustic element 1 having the above structure of the present example, as shown in FIG. 9B, shows a planar shape that approximates an ellipse, and is 23 [mm] in total length (L) and 16 [mm] in total width (W). Also, total height (H) is 1.5 [mm] which is made up of: thickness (0.1 mm) of diaphragm 8+height (0.4 mm) of corn coil spring 9+thickness (0.4 mm) of piezoelectric element 7+height (0.3 mm) of space 12+thickness (0.3 mm) of casing 5.

Example 2

Figure 12A:
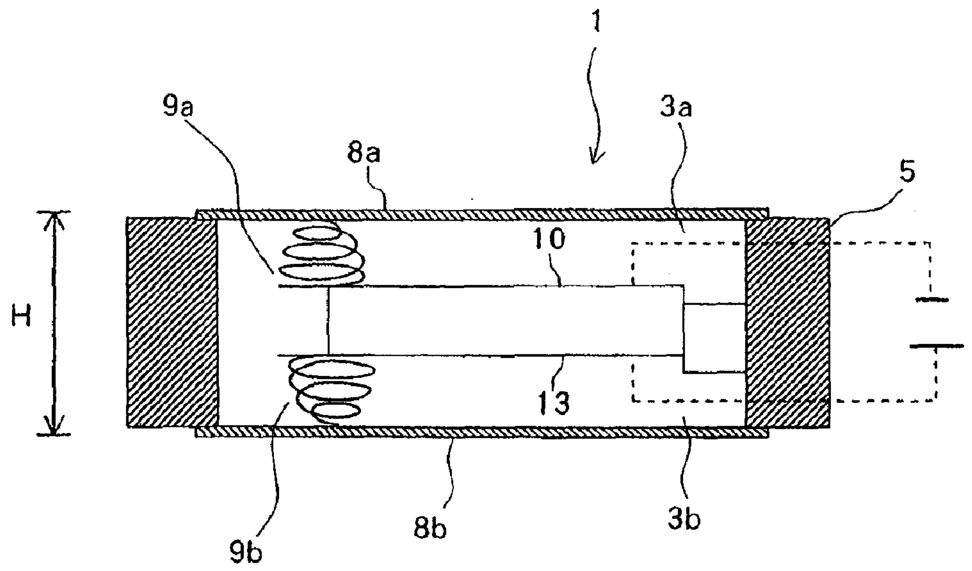
FIG. 12A is a longitudinal sectional view showing an arrangement of a piezoelectric acoustic element according to Example 2.
Figure 12B:
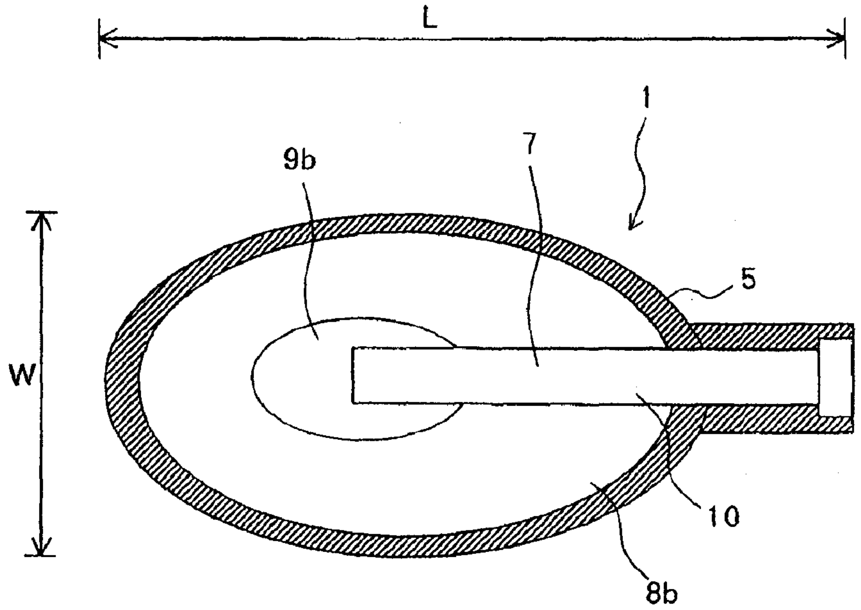
FIG. 12B is a transverse sectional view showing an arrangement of a piezoelectric acoustic element according to Example 2.

Explanations are given of the piezoelectric acoustic element of the present invention with reference to another example. FIG. 12A is a longitudinal sectional view showing a schematic arrangement of a piezoelectric acoustic element according to Example 2, and FIG. 12B is a transverse sectional view. In piezoelectric acoustic element 1 according to the present example, piezoelectric element 7, similar to the piezoelectric element of Example 1, is joined to diaphragms 8*a*, 8*b* extended over two openings 3*a*, 3*b* formed at the upper and lower sides. Diaphragms 8*a* extended over opening 3*a*, is a polyethylene terephthalate film having a thickness of 0.1 [mm], and is joined to upper surface 10 of piezoelectric element 7 through a corn coil spring (0.4 mm in height) as vibration transmitting member 9*a*. On the other hand, diaphragm 8*b*, extended over opening 3*b*, is a polyethylene terephthalate film having a thickness of 0.05 [mm], and is joined to lower surface 13 of piezoelectric element 7 through a corn coil spring (0.2 mm in height) as vibration transmitting member 9*b*. Incidentally, diameters (10 [mm]) of both diaphragms 8*a*, 8*b* are equal.

As shown in FIG. 12B, piezoelectric acoustic element 1 according to the present example has substantially the same form as the piezoelectric acoustic element of Example 1. However, diameters of diaphragms 8*a*, 8*b* in piezoelectric acoustic element 1 according to the present example are smaller than those of the diaphragms in the piezoelectric acoustic element of Example 1 (surface areas of diaphragms are smaller). Therefore, piezoelectric acoustic element 1 according to the present example is 20 [mm] in total length (L) and 11 [mm] in total width (W). Specifically, piezoelectric acoustic element 1 according to the present example is smaller than the piezoelectric acoustic element according to Example 1. Also, total height (H) is 1.15 [mm] which is made up of: thickness (0.05 mm) of diaphragm 8*b*+height (0.2 mm) of corn coil spring 9*b*+thickness (0.4 mm) of piezoelectric element 7+height (0.4 mm) of corn coil spring 9*a*+thickness (0.1 mm) of diaphragm 8*a*.

Incidentally, casing 8 and piezoelectric element 7 in piezoelectric acoustic element 1 according to the present example are similar to those of the piezoelectric acoustic element of Example 1. Also, the corn coil spring in piezoelectric acoustic element 1 according to the present example is similar to the corn coil spring in the piezoelectric acoustic element of Example 1 except for size.

Example 3

Figure 13A:
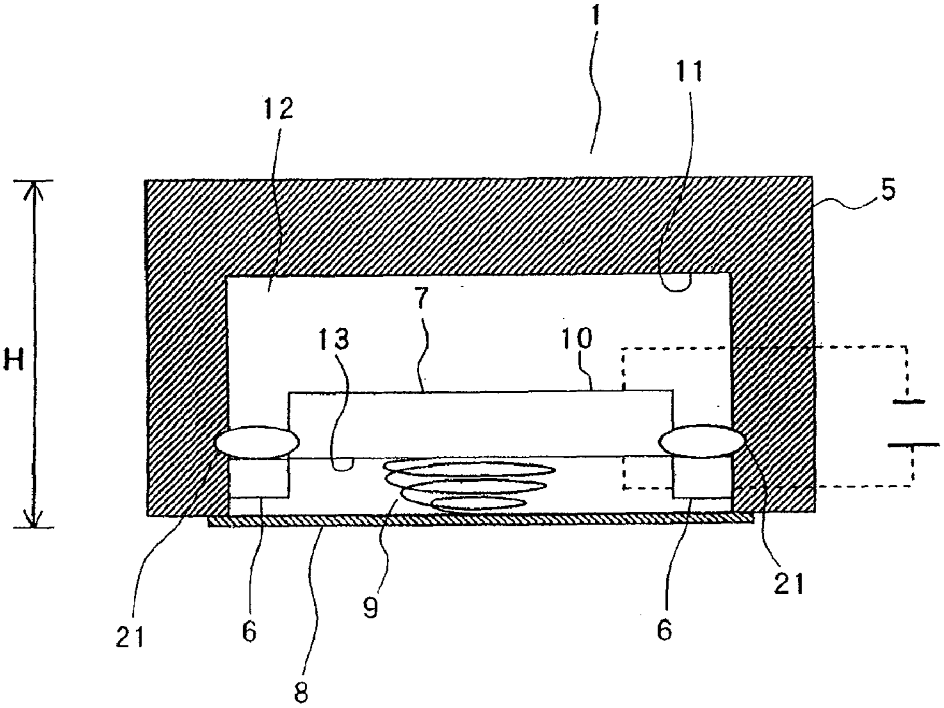
FIG. 13A is a longitudinal sectional view showing an arrangement of a piezoelectric acoustic element according to Example 3.
Figure 13B:
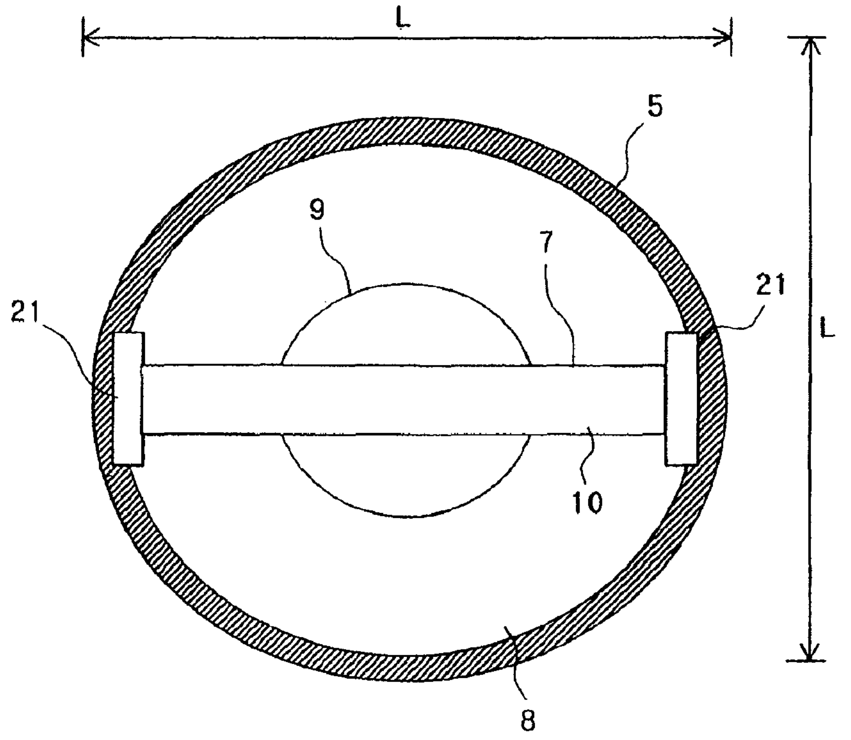
FIG. 13B is a transverse sectional view showing an arrangement of a piezoelectric acoustic element according to Example 3.

Explanations are given of the piezoelectric acoustic element of the present invention with reference to yet another example. FIG. 13A is a longitudinal sectional view showing a schematic arrangement of a piezoelectric acoustic element according to Example 3, and FIG. 13B is a transverse sectional view. In piezoelectric acoustic element 1 according to the present example, both ends of piezoelectric element 7 in the a longitudinal direction are joined to foamed rubbers 21, foamed rubbers 21 are joined to support members 6, and support members 6 are joined to the inner surface of casing 5. Specifically, both ends of piezoelectric element 7 in the longitudinal direction are each fixed to casing 5 through foamed rubber 21 and support member 6. Also, lower surface 13 at the approximate center in the longitudinal direction of piezoelectric element 7 is joined to diaphragm 8 through a corn coil spring as vibration transmitting member 9. Space 12 of that is 0.3 [mm] in height is formed between upper surface 10 and ceiling surface 11 of casing 5. Piezoelectric element 7 is manufactured by the same material and the same manufacturing method as the piezoelectric element of Example 1. Also, dimensions of piezoelectric element 7 are 20 [mm] in length, 4 [mm] in width, and 0.4 [mm] in thickness. As corn coil spring 9, the same corn coil spring as Example 1 is used. Further, a circular polyethylene terephthalate film that is 0.1 [mm] in thickness and 18 [mm] in diameter is used as diaphragm 8. Also, the thickness of casing 5 is 3 [mm].

As is clear from FIG. 13B, piezoelectric acoustic element 1 of the present has a planar shape that approximates a circle and is 22 [mm] in diameter (L). Also, the total height (H) is 1.5 [mm].

Example 4

Figure 14:
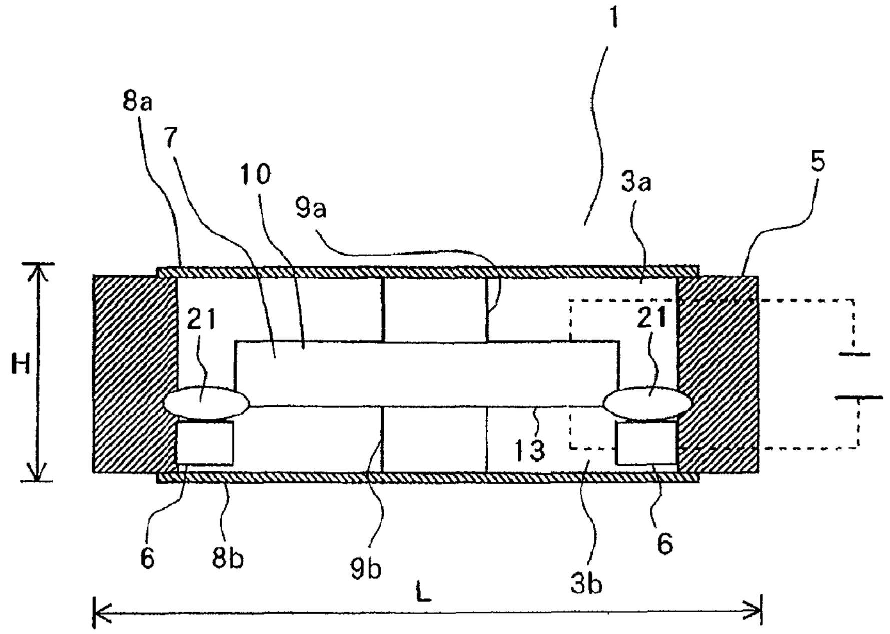
FIG. 14 is a longitudinal sectional view showing an arrangement of a piezoelectric acoustic element according to Example 4.

Explanations are given of the piezoelectric acoustic element of the present invention with reference to still another example. FIG. 14 is a longitudinal sectional view showing a schematic arrangement of a piezoelectric acoustic element according to Example 4. In piezoelectric acoustic element 1 according to the present example, the same kind of piezoelectric element 7 as the piezoelectric element of Example 1 is joined to diaphragms 8*a*, 8*b* that extend over openings 3*a*, 3*b* formed at the upper and lower sides of casing 5. Diaphragms 8*a*, 8*b* extended over two openings 3*a*, 3*b* are polyethylene terephthalate films of 10 [mm] in diameter and 0.05 [mm] in thickness in perfect circles. Also, vibration transmitting member 9*a* between upper surface 10 of piezoelectric element 7 and diaphragm 8*a* is a corn coil spring that is 0.2 [mm] in height. Vibration transmitting member 9*b* between lower surface 13 of piezoelectric element 7 and diaphragm 8*b* is a corn coil spring that is 0.4 [mm] in height. Piezoelectric element 7 of the present example is manufactured by the same material and by the same manufacturing method as the piezoelectric element of Example 1. Also, the dimensions of piezoelectric element 7 are 12 [mm] in length, 4 [mm] in width, and 0.4 [mm] in thickness. Corn coil springs, as vibration transmitting members 9*a*, 9*b*, are similar to the corn coil spring of Example 2. Both ends of piezoelectric element 7 are fixed to the inner surface of casing 5 through foamed rubbers 21 and support members 6, similar to Example 3. Piezoelectric acoustic element 1 has a planar shape that approximates a circle, similar to the piezoelectric acoustic element of Example 3, however, it is 14 [mm] in diameter (L) and 1.1 [mm] in total height (H) and is smaller and thinner than the piezoelectric acoustic element of Example 3.

Example 5

Figure 15:
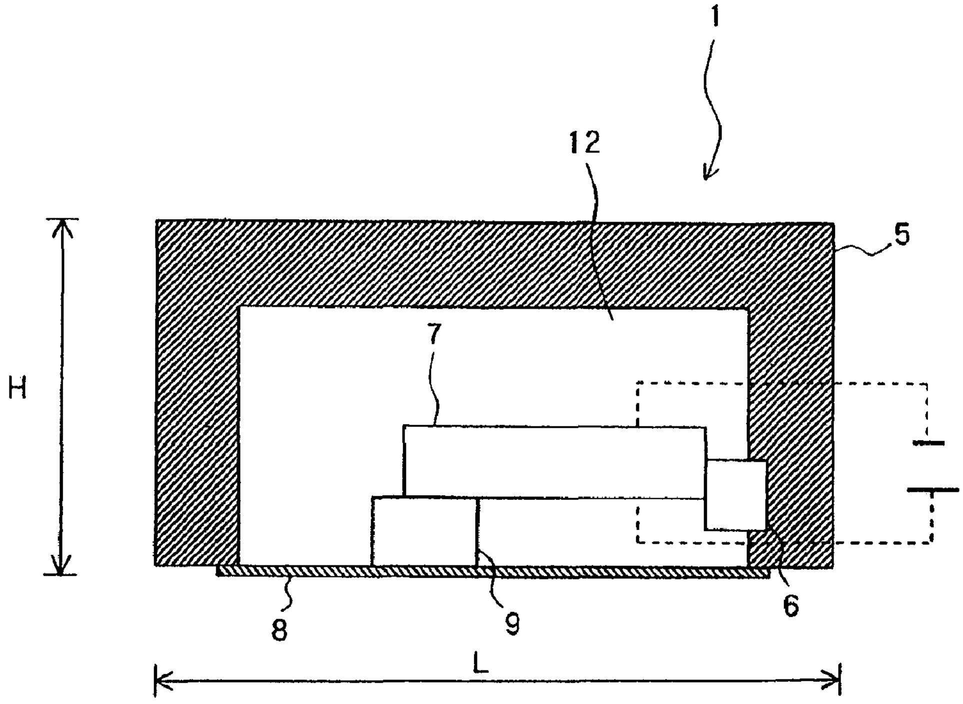
FIG. 15 is a longitudinal sectional view showing an arrangement of a piezoelectric acoustic element according to Example 5.
Figure 16:
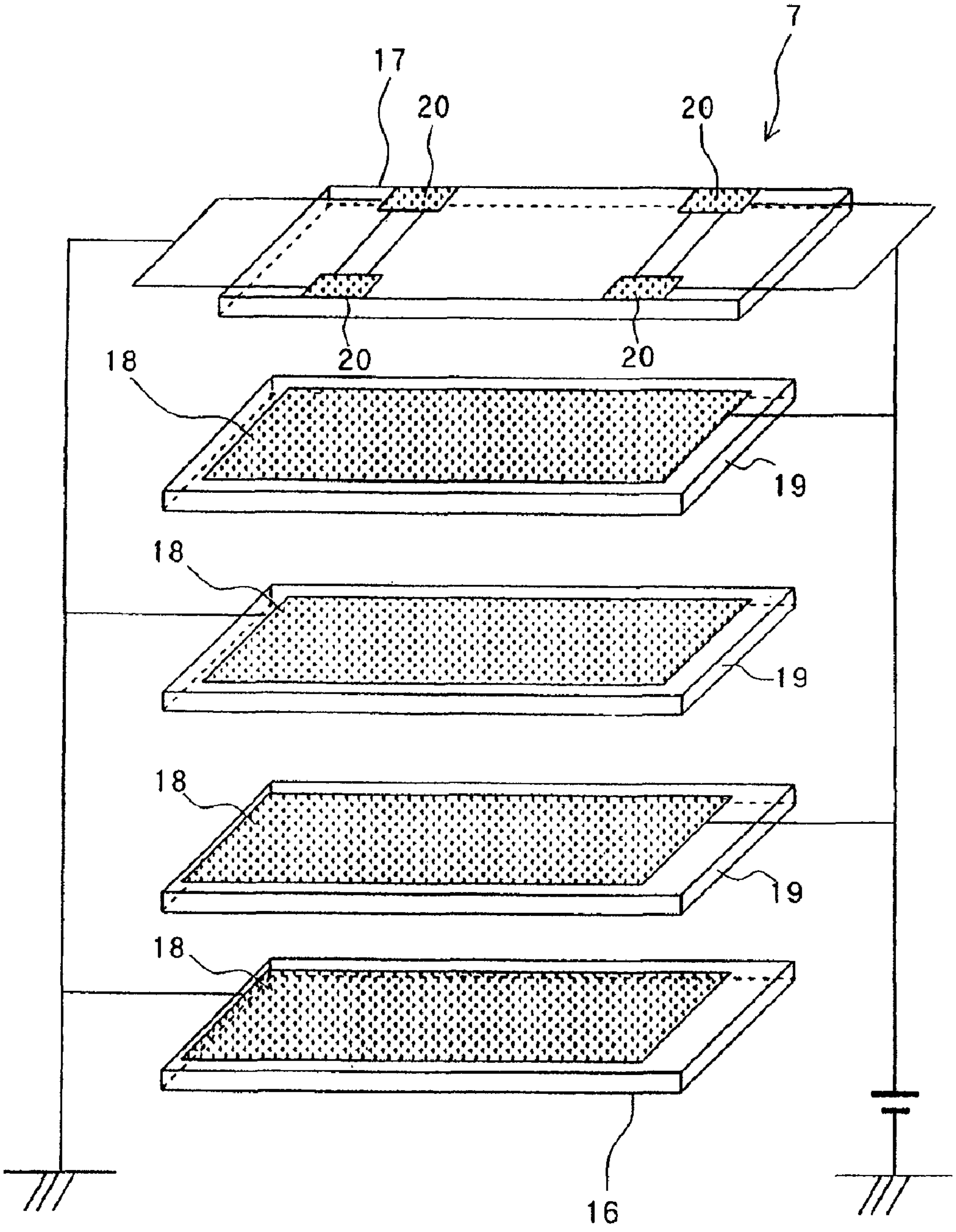
FIG. 16 is a perspective exploded view showing an arrangement of a piezoelectric element shown in FIG. 15.

Explanations are given of the piezoelectric acoustic element of the present invention with reference to still another example. FIG. 15 is a longitudinal sectional view showing a schematic arrangement of a piezoelectric acoustic element according to Example 5. Piezoelectric acoustic element 1 according to the present example is characterized in that piezoelectric element 7 shown in FIG. 16 is used. Piezoelectric element 7 shown in FIG. 16 has a multi-layered-structure (laminated structure) in which conductive layers 18 and piezoelectric material layers 19 are alternately laminated between lower insulating layers 16 and upper insulating layers 17. Upper and lower insulating layers 16, 17 and piezoelectric material layers 19 are 16 [mm] in length, 4 [mm] in width, and 40 [μm] in thickness. Conductive layers 18 is 16 [mm] in length, 4 [mm] in width, and 3 [μm] in thickness. Also, piezoelectric material layers 19 is eight-layered and conductive layers 18 is nine-layered (for convenience, layers are partially omitted in FIG. 16). Therefore, the dimensions of piezoelectric element 7 are 16 [mm] in length, 4 [mm] in width, and 0.4 [mm] in thickness. Lead zirconate titanate (PZT) ceramic is used for lower insulating layer 16, upper insulating layer 17, and piezoelectric material layer 19, and silver/palladium alloy (weight ratio 7:3) is used for electrode layers 18. Further, piezoelectric element 7 is manufactured by the green sheet method and is fired at 1100° C. in the atmosphere for two hours. Moreover, after a silver electrode that is used to electrically connect each conductive layers 18 is formed, the polarization process is applied to piezoelectric material layer 19, and electrode pads 20 formed on the surface of upper insulating layers 17 are electrically connected by copper foil.

The outer shape and size of piezoelectric acoustic element 1 of the present example are slimier to those of the piezoelectric acoustic element of Example 1. Specifically, piezoelectric acoustic element 1 has a planar shape that approximates a circle, and is 23 [mm] in total length (L), 1.5 [mm] in total height, and 16 [mm] in total width.

Example 6

Figure 17:
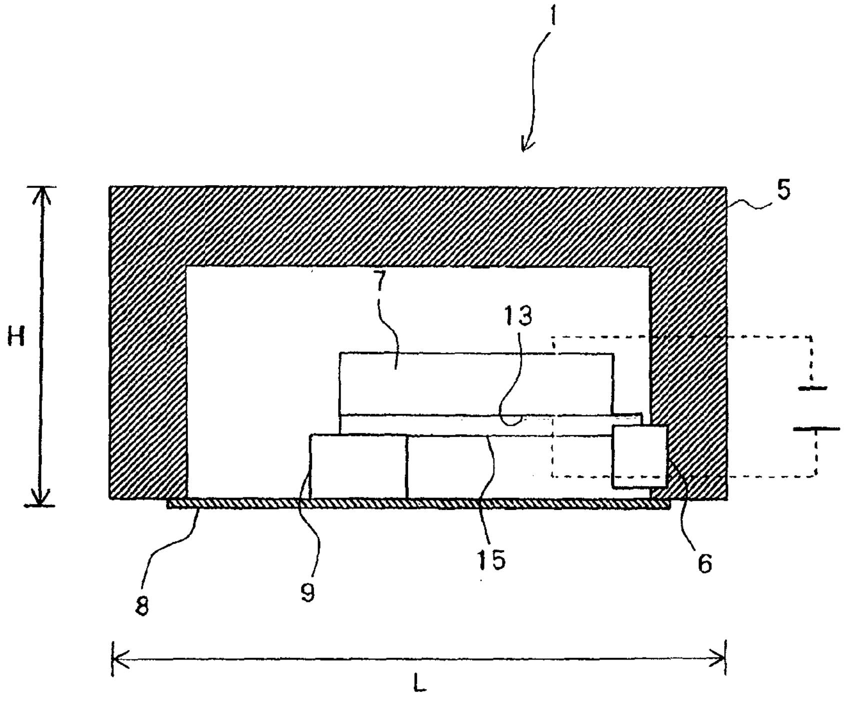
FIG. 17 is a longitudinal sectional view showing an arrangement of a piezoelectric acoustic element according to Example 6.
Figure 18:
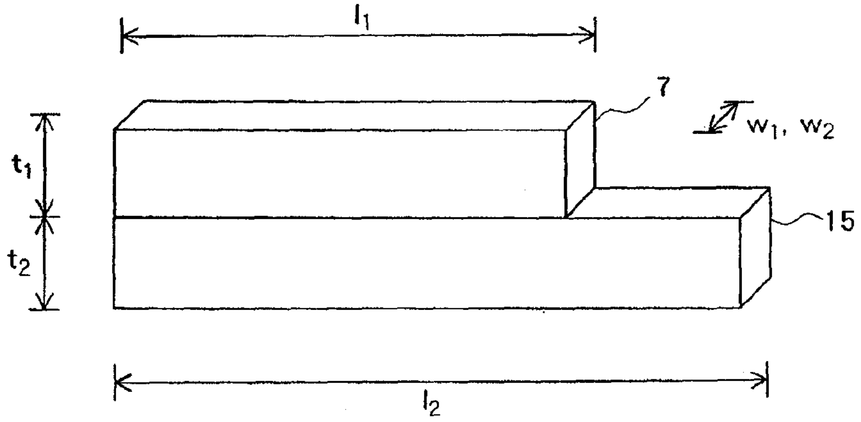
FIG. 18 is a perspective enlarged view showing arrangements of a piezoelectric element and an elastic plate shown in FIG. 17.

Explanations are given of the piezoelectric acoustic element of the present invention with reference to still another example. FIG. 17 is a longitudinal sectional view showing a schematic arrangement of a piezoelectric acoustic element according to Example 6. In piezoelectric acoustic element 1 according to the present example, metal elastic plate 15 is joined to lower surface 13 of piezoelectric element 7 by epoxy adhesive, and one end of elastic plate 15 is fixed to the inner surface of casing 5 through support member 6. Also, lower surface of another end of elastic plate 15 is joined to diaphragm 8 through a corn coil spring as vibration transmitting member 9. FIG. 18 shows an enlarged view of piezoelectric element 7 and elastic plate 15 in piezoelectric acoustic element 1 of the present example. Piezoelectric element 7 has the same laminated structure as the piezoelectric element of Example 5, and is 12 [mm] in length ($l_1$), 4 [mm] in width ($w_1$), and 0.4 [mm] in thickness ($t_1$). Also, elastic plate 15 is 15 [mm] in length ($l_2$), 4 [mm] in width ($W_2$), and 0.2 [mm] in thickness ($t_2$). The material of elastic plate 15 is SUS304.

Piezoelectric acoustic element 1 of the present example has a planar shape that approximates an ellipse, similarly to the piezoelectric element of Example 1. Also, piezoelectric acoustic element 1 is 23 [mm] in total length (L), 1.7 [mm] in total height (H), and 16 [mm] in total width. The thickness of elastic plate 15 causes an increase in the total height (H) by 0.2 [mm] in comparison with the piezoelectric acoustic element of Example 1.

Example 7

Figure 19:
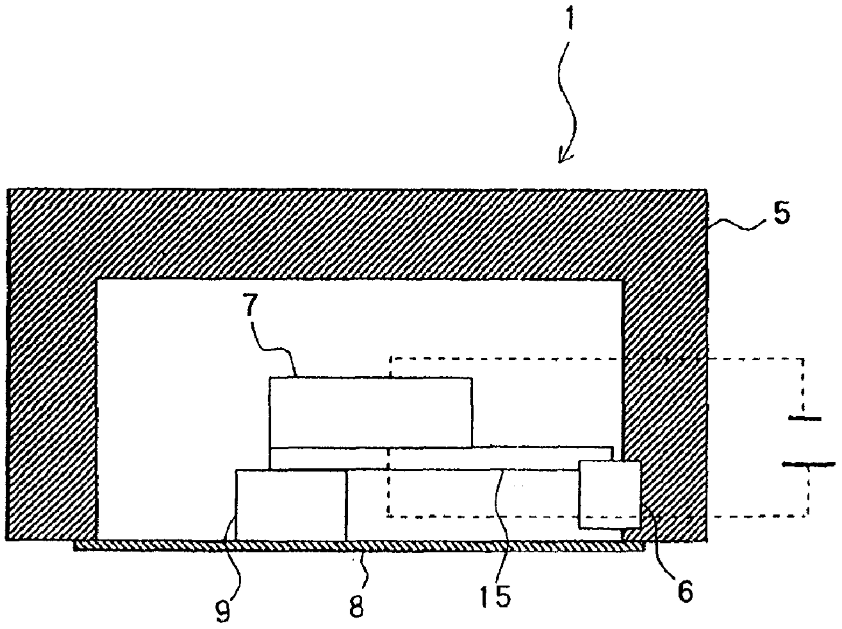
FIG. 19 is a longitudinal sectional view showing an arrangement of a piezoelectric acoustic element according to Example 7.
Figure 20:
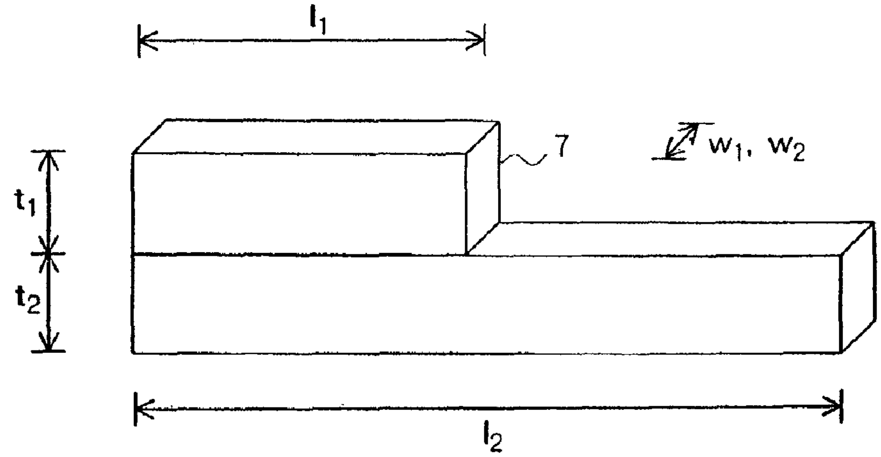
FIG. 20 is a perspective enlarged view showing arrangements of a piezoelectric element and an elastic plate shown in FIG. 19.

Explanations are given of the piezoelectric acoustic element of the present invention with reference to still another example. FIG. 19 is a longitudinal sectional view showing a schematic arrangement of a piezoelectric acoustic element according to Example 7. Piezoelectric acoustic element 1 according to the present example is characterized in that piezoelectric element 7 is shorter than the piezoelectric acoustic element of Example 6. Specifically, as shown in FIG. 20, metal elastic plate 15 that is 16 [mm] in length ($l_2$), 4 [mm] in width ($w_2$), and 0.2 [mm] in thickness ($t_2$) is joined to piezoelectric element 7 that is 8 [mm] in length ($l_1$), 4 [mm] in width ($w_1$), and 0.4 [mm] in thickness ($t_1$) by epoxy adhesive. The arrangements, except for piezoelectric element 7, are similar to those of the piezoelectric acoustic element of Example 6.

Example 8

Figure 21:
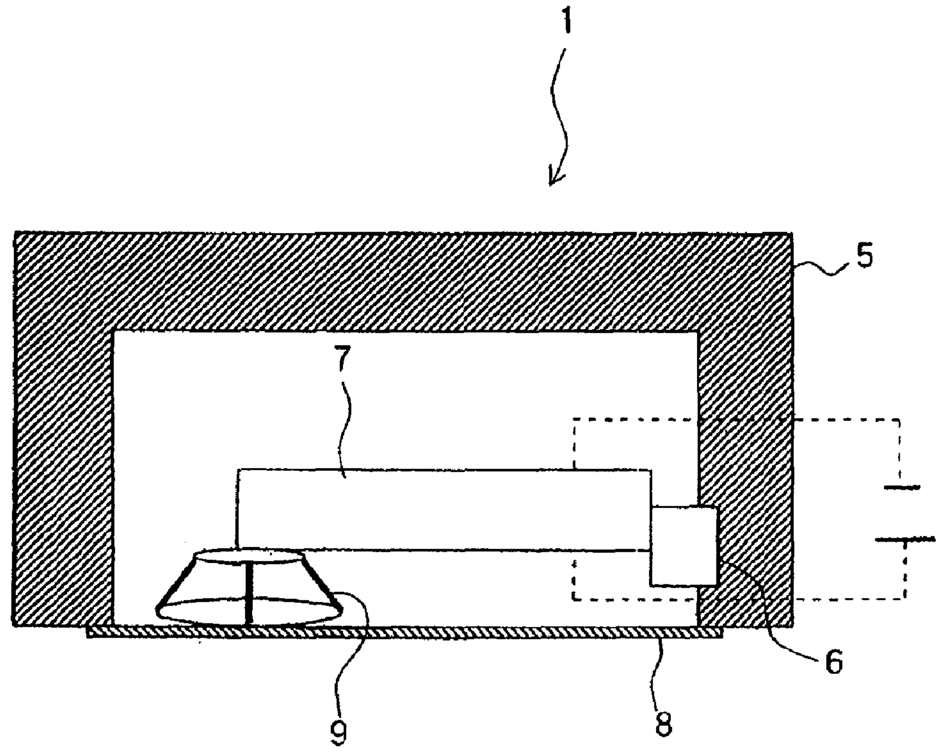
FIG. 21 is a longitudinal sectional view showing an arrangement of a piezoelectric acoustic element according to Example 8.
Figure 22:
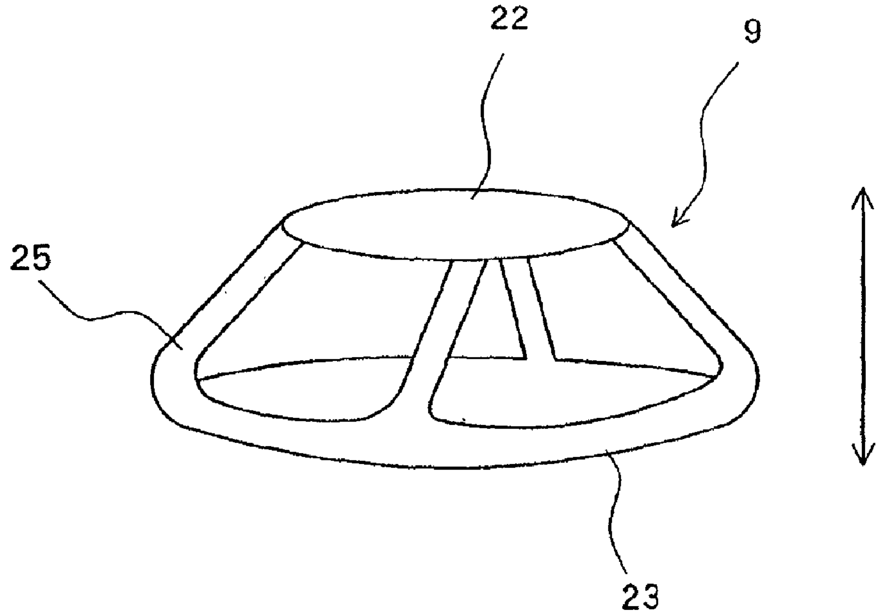
FIG. 22 is a perspective enlarged view showing a spring shown in FIG. 21.

Explanations are given of the piezoelectric acoustic element of the present invention with reference to still another example. FIG. 21 is a longitudinal sectional view showing a schematic arrangement of a piezoelectric acoustic element according to Example 8. Piezoelectric acoustic element 1 according to the present example is characterized in that a spring is used as a vibration transmitting member for joining piezoelectric element 7 and diaphragm 8. This spring is formed by connecting the rim of upper member 22 having a disc shape 2 [mm] in diameter and the rim of lower member 23 having a ring shape 4 [mm] in diameter by leg member 25 that has a thin plate shape and has elasticity mainly in the direction indicated by an arrow. Incidentally, the height of the spring is 0.4 [mm]. The arrangements, except for vibration transmitting member 9, are similar to those of the piezoelectric acoustic element of Example 1, and the total length (L) is 23 [mm], the total height (H) is 16 [mm].

(Characteristic Evaluation)

Explanations are given of measurement results of the characteristics of the piezoelectric acoustic elements of Examples 1 to 8, which are explained above, and of the characteristics of Comparative Examples 1 to 4. First, the arrangements of Comparative Examples 1 to 4 are outlined, and then explanations are given of the measurement results.

Comparative Example 1

Figure 23:
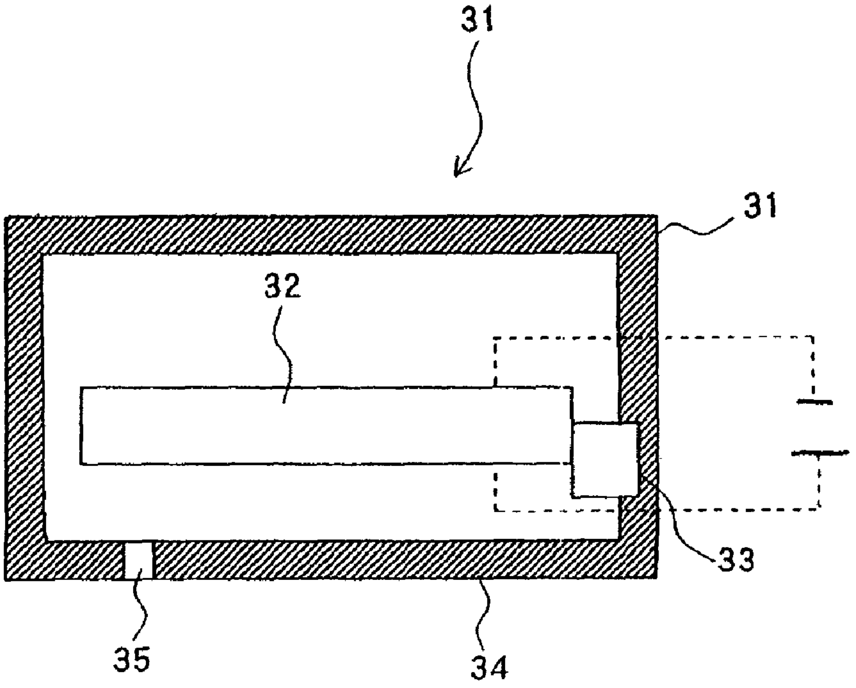
FIG. 23 is a longitudinal sectional view showing an arrangement of an acoustic element according to Comparative Example 1.

FIG. 23 shows a schematic arrangement of acoustic element 30 of Comparative Example 1. Acoustic element 30 is a piezoelectric acoustic element and has piezoelectric element 32 as the same piezoelectric element of Example 1 located in casing 31 that is formed of the same material and in the same size as the casing of Example 1. One end of piezoelectric element 32 is fixed to the inner surface of casing 31 through the same support member 33 as the support member of Example 1, and the other end is a free end. Also, hole 35 is formed in bottom 34 of casing 31, and sounds are radiated from hole 35 when voltage is applied to piezoelectric element 32.

Comparative Example 2

Figure 24:
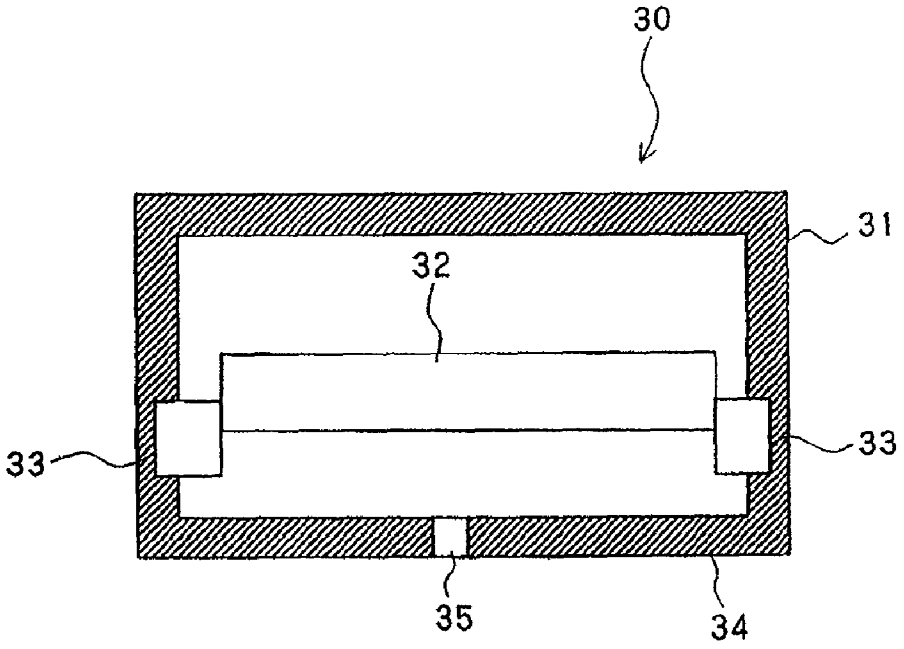
FIG. 24 is a longitudinal sectional view showing an arrangement of an acoustic element according to Comparative Example 2.

FIG. 24 shows a schematic arrangement of acoustic element 30 of Comparative Example 2. Acoustic element 30 is also a piezoelectric acoustic element and basically has the same arrangement as the acoustic element of Comparative Example 1. The differences are that both ends of piezoelectric element 32 are fixed to the inner surface of casing 31 and hole 35 is formed at the center of bottom 34.

Comparative Example 3

Figure 25:
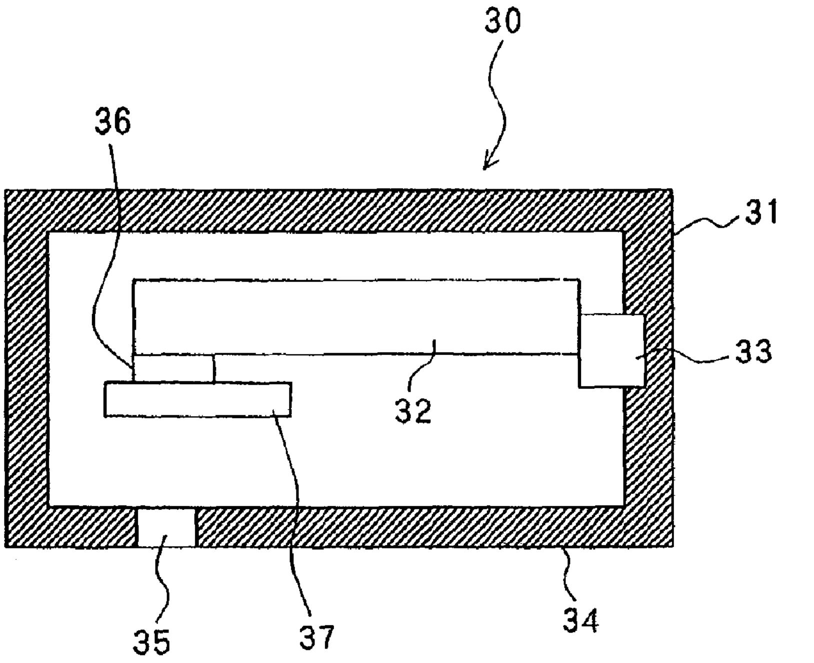
FIG. 25 is a longitudinal sectional view showing an arrangement of an acoustic element according to Comparative Example 3.

FIG. 25 shows a schematic arrangement of acoustic element 30 of Comparative Example 3. Acoustic element 30 is also a piezoelectric acoustic element and basically has the same arrangement as the piezoelectric acoustic element of Comparative Example 1. The differences are that the free end of piezoelectric element 32 is provided with metal vibration plate 37 through connection member 36.

Comparative Example 4

Figure 26:
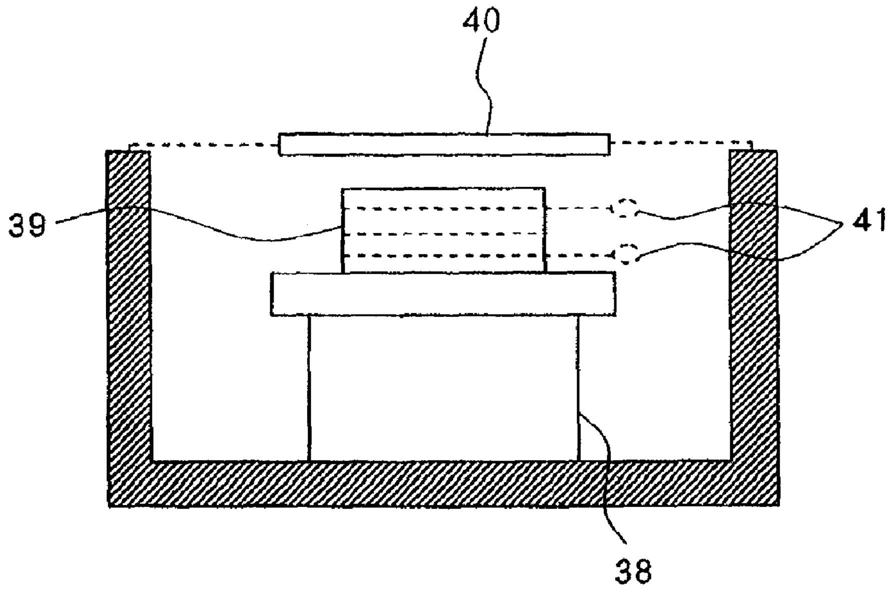
FIG. 26 is a longitudinal sectional view showing an arrangement of an acoustic element according to Comparative Example 4.

FIG. 26 shows a schematic arrangement of acoustic element 30 of Comparative Example 4. Acoustic element 30 is an electromagnetic acoustic element having permanent magnet 38, voice coil 39, and vibration plate 40. When a current is input to voice coil 39 through electric terminal 41, a magnetic force is generated, and vibration plate 40 is vibrated by the generated magnetic force to produce sounds.

(Measurement Result 1)

When the basic resonant frequencies of the piezoelectric acoustic elements of Examples 1 to 8 and the acoustic elements of Comparative Examples 1 to 4 are measured, the following results are obtained.

Example 1: 443 [Hz]
Example 2: 452 [Hz] and 316 [Hz]
Example 3: 496 [Hz]
Example 4: 491 [Hz] and 320 [Hz]
Example 5: 396 [Hz]
Example 6: 276 [Hz]
Example 7: 263 [Hz]
Example 8: 370 [Hz]
Comparative Example 1: 1087 [Hz] or more
Comparative Example 2: 1067 [Hz]
Comparative Example 3: 1027 [Hz]
Comparative Example 4: 730 [Hz]

With the above measurement results, it can be understood that the piezoelectric acoustic element of the present invention has a wider frequency band. In particular, it can be understood that the piezoelectric acoustic elements of Examples 2 and 4 have two basic resonant frequencies and the frequency band is enlarged.

(Measurement Result 2)

When the sound pressure level is measured while the voltage of 1 M is applied to the piezoelectric acoustic elements of Examples 1 to 8 and to the acoustic elements of Comparative Examples 1 to 4, the following results are obtained.

Example 1: 96 [dB]
Example 2: 92 [dB]
Example 3: 91 [dB]
Example 4: 99 [dB]
Example 5:107 [dB]
Example 6: 106 [dB]
Example 7:118 [dB]
Example 8: 97 [dB]
Comparative Example 1: 38 [dB]
Comparative Example 2: 57 [dB]
Comparative Example 3: 74 [dB]
Comparative Example 4: 72 [dB]

With the above measurement results, it can be understood that the piezoelectric acoustic element of the present invention can reproduce a very high sound pressure. In particular, the sound pressure level is 91 [dB] when the voltage of 0.5 [V] is applied to the piezoelectric acoustic element of Example 5. In other words, almost the same level of sound pressure that was obtained by the piezoelectric acoustic element in Examples 1 to 3 can be obtained in this case, even though the applied voltage is one-half.

(Measurement Result 3)

When the sound pressures of the acoustic elements of Examples 1 to 8 and Comparative Examples 1 to 4 at frequencies of 500 [Hz] to 2000 [Hz] are measured and the alienation rate between the maximum sound pressure and the minimum sound pressure is calculated, the following results are obtained.

Examples 1 to 8: 25% or less
Comparative Examples 1 to 3: more than 40%
Comparative Example 4: more than 25%, and less than 40%

With the above measurement result, it can be understood that the piezoelectric acoustic element of the present invention has a flat sound frequency characteristic.

(Measurement Result 4)

When the sound pressure levels are measured before and after a free fall of 50 cm for the piezoelectric acoustic elements of Examples 1 to 8 and the acoustic elements of Comparative Examples 1 to 4, and when the change rate is calculated, the following results are obtained.

Examples 1, 2: 3% or less
Example 3: more than 3% and 10% or less
Examples 4 to 7: 3% or less
Example 8: more than 3% and 10% or less
Comparative Examples 1 to 4: more than 10%

With the above measurement result, it can be understood that the piezoelectric acoustic element has excellent shock resistant characteristics.

(Measurement Result 5)

When the piezoelectric acoustic elements of Examples 1 to 8 and the acoustic elements of Comparative Examples 1 to 4 are continuously driven for 100 hours, and when the sound pressures are measured before and after that, and the change rate is calculated, the following results are obtained.

Examples 1, 2: more than 3%, and 10% or less
Examples 3 to 8: 3% or less
Comparative Examples 1 to 4: 10% or more With the above measurement result, it can be understood that the piezoelectric acoustic element of the present invention has sufficient durability and high reliability.

(Measurement Result 6)

When 50 pieces of the piezoelectric acoustic elements for each of Examples 1 to 8 and 50 pieces of the acoustic elements for each of Comparative Examples 1 to 4 are respectively manufactured, the sound pressure level is measured when the voltage of 1 [V] is applied to each element, and then the alienation rate between the maximum value and the minimum value is calculated, and the following results are obtained.

Examples 1, 2: 2.5% or less

Example 3: more than 5%, and 15% or less

Examples 4 to 7: 5% or less

Example 8: more than 5%, and 15% or less

Comparative Examples 1 to 4: more than 15%

With the above measurement result, it can be understood that variations are small among the manufactured pieces in the piezoelectric acoustic element of the present invention.

The above measurement results are summarized in Table 1. Incidentally, in measurement result 1, "◎" (very good) is shown when the basic resonant frequency is 300 [Hz] or less, "○" (good) is shown when the basic resonant frequency is more than 300 [Hz] and 500 [Hz] or less, "Δ" (average) is shown when the basic resonant frequency is more than 700 [Hz], and 1000 [Hz] or less, and "X" (poor) is shown when the basic resonant frequency is more than 1000 [Hz].

In measurement result 2, "◎" is shown when the sound pressure level is more than 90 [dB], and "X" is shown when the basic resonant frequency is 90 [dB] or less.

In measurement results 3 and 6, "○" is shown when the alienation rate is 25% or less, "Δ" is shown when the alienation rate is more than 25%, and 40% or less, and "X" is shown when the alienation rate is more than 40%.

In measurement results 4 and 5, "○" is shown when the sound pressure change is 3% or less, "Δ" is shown when the sound pressure change is more than 3%, and 10% or less, and "X" is shown when the sound pressure change is more than 10%.

In measurement result 6, "○" is shown when the alienation rate is 5% or less, "Δ" is shown when the alienation rate is more than 5%, and 15% or less, and "X" is shown when the alienation rate is more than 15%.

When the above explanations and measurement results 1 to 6 are considered, it can be understood that the piezoelectric acoustic element of the present invention has various advantages, such as reduced in thickness and size, low voltage drivability, high sound pressure reproducibility, wide frequency characteristic, low cost, and high reliability.

Also, it can be understood that the piezoelectric acoustic element of the present invention is available for a broad range of applications including acoustic devices and portable terminal devices. For example, when the piezoelectric acoustic element of the present invention is arranged in an acoustic device, a small and high-quality acoustic device can be attained. Also, when the piezoelectric acoustic element of the present invention is arranged, instead of an electromagnetic acoustic element used in conventional mobile telephones or PDAs (Personal Digital Assistants), higher sound quality can be obtained while attaining size reduction and extending operating time in mobile telephones and PDAs.

While preferred embodiments of the present invention have been described using specific terms, such description is for illustrative purposes only, and it is to be understood that changes and variations may be made without departing from the spirit or scope of the following claims.

The invention claimed is:

1. A piezoelectric acoustic element using a piezoelectric element as a vibration source, comprising:

a hollow casing having at least one opening and a side wall;

a diaphragm provided at the opening of said casing;

said side wall extending in a direction normal to a plane of the opening and normal to a surface of the diaphragm; and a piezoelectric element disposed in said casing, and attached at one end of said piezoelectric element in a longitudinal direction to said side wall of said casing by a first support member, and attached at a second end of said piezoelectric element in a longitudinal direction to said side wall of said casing by a second support member for pivotal movement with respect to said first and second support members about an axis through said first and second support members, respectively, and that bends about said axis when a voltage is applied thereto;

TABLE 1

| | Measurement Result 1 | Measurement Result 2 | Measurement Result 3 | Measurement Result 4 | Measurement Result 5 | Measurement Result 6 |
|---|---|---|---|---|---|---|
| Example 1 | ○(443 Hz) | ○(96 dB) | ○ | ○ | Δ | ○ |
| Example 2 | ○(452 Hz)<br>○(316 Hz) | ○(92 dB) | ○ | Δ | Δ | ○ |
| Example 3 | ○(496 Hz) | ○(91 dB) | ○ | ○ | ○ | Δ |
| Example 4 | ○(491 Hz)<br>◎(320 Hz) | ○(99 dB) | ○ | ○ | ○ | ○ |
| Example 5 | ○(406 Hz) | ○(107 dB) | ○ | ○ | ○ | ○ |
| Example 6 | ◎(276 Hz) | ○(106 dB) | ○ | ○ | ○ | ○ |
| Example 7 | ◎(263 Hz) | ○(118 dB) | ○ | ○ | ○ | ○ |
| Example 8 | ○(370 Hz) | ○(97 dB) | ○ | ○ | ○ | Δ |
| Comparative Example 1 | x(1087 Hz) | Δ(38 dB) | x | x | x | x |
| Comparative Example 2 | x(1067 Hz) | x(52 dB) | x | x | x | x |
| Comparative Example 3 | x(1027 Hz) | x(74 dB) | x | x | x | x |
| Comparative Example 4 | Δ(730 Hz) | x(72 dB) | Δ | x | x | x |

wherein said first support member has a coefficient of elasticity that is different from a coefficient of elasticity of said second support member, wherein said piezoelectric element has a laminated structure in which conductive layers and piezoelectric material layers are alternately laminated, and wherein said piezoelectric element and said diaphragm are joined through a vibration transmitting member.

2. The piezoelectric acoustic element according to claim 1, wherein both ends of said piezoelectric element in a longitudinal direction are fixed to an inner surface of said side wall of said casing through a respective support member.

3. The piezoelectric acoustic element according to claim 2, wherein said support member is elastic.

4. The piezoelectric acoustic element according to claim 1, further comprising two or more diaphragms and/or vibration transmitting members that are different as regards at least one of thickness, materials, and size.

5. The piezoelectric acoustic element according to claim 1, further comprising two diaphragms that are arranged opposite to each other so that said piezoelectric element is in between them, wherein said two diaphragms are joined to said piezoelectric element through respective vibration transmitting members.

6. The piezoelectric acoustic element according to claim 1, further comprising an elastic plate joined to said piezoelectric element, wherein said elastic plate is joined to said diaphragm through said vibration transmitting member.

7. The piezoelectric acoustic element according to claim 1, wherein said vibration transmitting member is a spring.

8. The piezoelectric acoustic element according to claim 1, wherein said diaphragm is formed of a film selected from the group consisting of a polyethylene terephthalate film, a polyethersulfone film, a polyester film, and a polypropylene film.

9. An acoustic device provided with the piezoelectric acoustic element according to claim 1.

10. A portable terminal device provided with the piezoelectric acoustic element according to claim 1.

11. The piezoelectric acoustic element according to claim 1, wherein said vibration transmitting member is elastic.

* * * * *